(12) United States Patent
Valcore, Jr. et al.

(10) Patent No.: US 9,502,221 B2
(45) Date of Patent: Nov. 22, 2016

(54) ETCH RATE MODELING AND USE THEREOF WITH MULTIPLE PARAMETERS FOR IN-CHAMBER AND CHAMBER-TO-CHAMBER MATCHING

(71) Applicant: Lam Research Corporation, Fremont, CA (US)

(72) Inventors: John C. Valcore, Jr., Berkeley, CA (US); Harmeet Singh, Fremont, CA (US); Henry Povolny, Newark, CA (US)

(73) Assignee: Lam Research Corporation, Fremont, CA (US)

(*) Notice: Subject to any disclaimer, the term of this patent is extended or adjusted under 35 U.S.C. 154(b) by 381 days.

(21) Appl. No.: 14/243,705

(22) Filed: Apr. 2, 2014

(65) Prior Publication Data
US 2015/0032245 A1    Jan. 29, 2015

Related U.S. Application Data

(60) Provisional application No. 61/858,985, filed on Jul. 26, 2013.

(51) Int. Cl.
*H01J 7/24* (2006.01)
*H01J 31/26* (2006.01)
(Continued)

(52) U.S. Cl.
CPC ....... *H01J 37/32926* (2013.01); *G05B 19/418* (2013.01); *H01J 37/3299* (2013.01); *H01J 37/32183* (2013.01); *H01J 37/32935* (2013.01)

(58) Field of Classification Search
CPC ...... H01J 7/24; H01J 31/26; H01J 37/32183; H01J 37/32926; H01J 37/32935; H01J 37/3299; G05B 19/418

USPC ............ 315/111.01, 111.21, 111.41, 111.51, 315/111.71; 156/345.21, 345.28, 345.48
See application file for complete search history.

(56) References Cited

U.S. PATENT DOCUMENTS

| 4,353,777 A | 10/1982 | Jacob |
| 4,377,961 A | 3/1983 | Bode |

(Continued)

FOREIGN PATENT DOCUMENTS

| CN | 101110347 A | 1/2008 |
| JP | 2001-127045 A | 5/2001 |

(Continued)

OTHER PUBLICATIONS

Lars Christoph, Comparison of Applied Materials DPS Chambers used for poly-Si Etch process by Plasma Parameters, Dec. 6, 2000, 2nd workshop on self excited electron plasma resonance spectroscopy, Dresden,Germany.

(Continued)

*Primary Examiner* — Jimmy Vu
(74) *Attorney, Agent, or Firm* — Martine Penilla Group, LLP

(57) ABSTRACT

A method includes receiving a voltage and current measured at an output of an RF generator of a first plasma system and calculating a first model etch rate based on the voltage and current, and a power. The method further includes receiving a voltage and current measured at an output of the RF generator of a second plasma system, determining a second model etch rate based on the voltage and current at the output of the RF generator of the second plasma system, and comparing the second model etch rate with the first model etch rate. The method includes adjusting a power at the output of the RF generator of the second plasma system to achieve the first model etch rate associated with the first plasma system upon determining that the second model etch rate does not match the first model etch rate. The method is executed by a processor.

23 Claims, 10 Drawing Sheets

(51) Int. Cl.
*H01J 37/32* (2006.01)
*G05B 19/418* (2006.01)

(56) References Cited

U.S. PATENT DOCUMENTS

| | | | |
|---|---|---|---|
| 4,420,790 A | 12/1983 | Golke et al. | |
| 4,454,001 A | 6/1984 | Sternheim et al. | |
| 4,457,820 A | 7/1984 | Bergeron et al. | |
| 4,500,563 A | 2/1985 | Ellenberger et al. | |
| 4,504,799 A | 3/1985 | Elmis et al. | |
| 4,855,897 A | 8/1989 | Shinskey | |
| 5,053,725 A | 10/1991 | Gesche et al. | |
| 5,474,648 A | 12/1995 | Patrick et al. | |
| 5,479,340 A | 12/1995 | Fox et al. | |
| 5,556,549 A | 9/1996 | Patrick et al. | |
| 5,571,366 A | 11/1996 | Ishii et al. | |
| 5,689,215 A | 11/1997 | Richardson et al. | |
| 5,694,207 A | 12/1997 | Hung et al. | |
| 5,737,177 A | 4/1998 | Mett et al. | |
| 5,764,471 A | 6/1998 | Burkhart | |
| 5,788,801 A | 8/1998 | Barbee et al. | |
| 5,810,963 A | 9/1998 | Tomioka | |
| 5,812,361 A | 9/1998 | Jones et al. | |
| 5,866,985 A | 2/1999 | Coultas et al. | |
| 5,889,252 A | 3/1999 | Williams et al. | |
| 5,892,198 A | 4/1999 | Barnes et al. | |
| 5,894,400 A | 4/1999 | Graven et al. | |
| 5,980,767 A | 11/1999 | Koshimizu et al. | |
| 5,989,999 A | 11/1999 | Levine et al. | |
| 6,017,414 A * | 1/2000 | Koemtzopoulos | H01J 37/32862 134/1.1 |
| 6,020,794 A | 2/2000 | Wilbur | |
| 6,021,672 A | 2/2000 | Lee | |
| 6,042,686 A | 3/2000 | Dible et al. | |
| 6,048,435 A | 4/2000 | DeOrnelias et al. | |
| 6,110,214 A | 8/2000 | Klimasauskas | |
| 6,157,867 A | 12/2000 | Hwang et al. | |
| 6,198,616 B1 | 3/2001 | Dahimene et al. | |
| 6,246,972 B1 | 6/2001 | Klimasauskas | |
| 6,431,112 B1 | 8/2002 | Sill et al. | |
| 6,441,555 B1 | 8/2002 | Howald et al. | |
| 6,472,822 B1 | 10/2002 | Chen et al. | |
| 6,522,121 B2 | 2/2003 | Coumou | |
| 6,535,785 B2 | 3/2003 | Johnson et al. | |
| 6,597,002 B1 | 7/2003 | Kondo | |
| 6,669,783 B2 | 12/2003 | Sexton et al. | |
| 6,677,246 B2 | 1/2004 | Scanlan et al. | |
| 6,750,711 B2 | 6/2004 | Chawla et al. | |
| 6,781,317 B1 | 8/2004 | Goodman | |
| 6,823,815 B2 | 11/2004 | Han et al. | |
| 6,838,635 B2 | 1/2005 | Hoffman et al. | |
| 6,862,557 B2 | 3/2005 | Jones et al. | |
| 6,873,114 B2 | 3/2005 | Avoyan et al. | |
| 6,972,524 B1 | 12/2005 | Marakhtanov et al. | |
| 6,983,215 B2 | 1/2006 | Coumou et al. | |
| 7,042,311 B1 | 5/2006 | Hilliker et al. | |
| 7,122,965 B2 | 10/2006 | Goodman | |
| 7,169,625 B2 | 1/2007 | Davis et al. | |
| 7,323,116 B2 | 1/2008 | Guiney et al. | |
| 7,359,177 B2 | 4/2008 | Yang et al. | |
| 7,361,287 B2 | 4/2008 | Laermer | |
| 7,375,038 B2 | 5/2008 | Kumar | |
| 7,435,926 B2 | 10/2008 | Jafarian-Tehrani | |
| 7,459,100 B2 | 12/2008 | Kiemasz et al. | |
| 7,480,571 B2 | 1/2009 | Howald et al. | |
| 7,505,879 B2 | 3/2009 | Tomoyasu et al. | |
| 7,586,100 B2 | 9/2009 | Raj et al. | |
| 7,728,602 B2 | 6/2010 | Valcore et al. | |
| 7,764,140 B2 | 7/2010 | Nagarkatti et al. | |
| 7,768,269 B2 | 8/2010 | Piptone et al. | |
| 7,858,898 B2 | 12/2010 | Bailey, III et al. | |
| 7,967,944 B2 | 6/2011 | Shannon et al. | |
| 8,040,068 B2 | 10/2011 | Coumou et al. | |
| 8,053,991 B2 | 11/2011 | Kim et al. | |
| 8,080,168 B2 | 12/2011 | Cirigliano | |
| 8,080,760 B2 | 12/2011 | Dhindsa et al. | |
| 8,103,492 B2 | 1/2012 | Brcka | |
| 8,264,238 B1 | 9/2012 | El-Chouelry | |
| 8,271,121 B2 | 9/2012 | Venugopal et al. | |
| 8,368,308 B2 | 2/2013 | Banna et al. | |
| 8,404,598 B2 | 3/2013 | Liao et al. | |
| 8,501,631 B2 | 8/2013 | Valcore et al. | |
| 8,679,358 B2 | 3/2014 | Nakagawa | |
| 8,901,935 B2 | 12/2014 | Valcore et al. | |
| 2003/0082835 A1 | 5/2003 | McChesney et al. | |
| 2003/0103793 A1 | 6/2003 | Murakoshi et al. | |
| 2003/0119308 A1 | 6/2003 | Geefay et al. | |
| 2004/0028837 A1 | 2/2004 | Fink | |
| 2004/0045506 A1 | 3/2004 | Chen et al. | |
| 2004/0060660 A1 | 4/2004 | Klimecky et al. | |
| 2004/0061448 A1 | 4/2004 | Avoyan et al. | |
| 2004/0087047 A1 | 5/2004 | Jaiswal et al. | |
| 2004/0107906 A1 | 6/2004 | Collins et al. | |
| 2004/0135590 A1 | 7/2004 | Quon | |
| 2004/0222184 A1 | 11/2004 | Hayami et al. | |
| 2004/0226657 A1 | 11/2004 | Hoffman | |
| 2005/0039682 A1 | 2/2005 | Dhindsa et al. | |
| 2005/0057165 A1 | 3/2005 | Goodman | |
| 2005/0090118 A1 | 4/2005 | Shannon et al. | |
| 2005/0133163 A1 | 6/2005 | Shannon et al. | |
| 2005/0134186 A1 | 6/2005 | Brouk et al. | |
| 2005/0151479 A1 | 7/2005 | Avoyan et al. | |
| 2005/0205532 A1 | 9/2005 | Patrick et al. | |
| 2005/0217797 A1 | 10/2005 | Jafarian-Tehrani | |
| 2005/0241762 A1 | 11/2005 | Paterson et al. | |
| 2005/0252884 A1 | 11/2005 | Lam et al. | |
| 2006/0054596 A1 | 3/2006 | Howard | |
| 2006/0065623 A1 | 3/2006 | Guiney et al. | |
| 2006/0065631 A1 | 3/2006 | Cheng et al. | |
| 2006/0065632 A1 | 3/2006 | Cheng et al. | |
| 2006/0088655 A1 | 4/2006 | Collins et al. | |
| 2006/0100824 A1 | 5/2006 | Moriya | |
| 2006/0169582 A1 | 8/2006 | Brown et al. | |
| 2006/0231526 A1 | 10/2006 | Donohue | |
| 2006/0232471 A1 | 10/2006 | Coumou | |
| 2007/0021935 A1 | 1/2007 | Larson et al. | |
| 2007/0065594 A1 | 3/2007 | Chiang et al. | |
| 2007/0095788 A1 | 5/2007 | Hoffman et al. | |
| 2007/0127188 A1 | 6/2007 | Yang et al. | |
| 2007/0247074 A1 | 10/2007 | Paterson et al. | |
| 2007/0252580 A1 | 11/2007 | Dine et al. | |
| 2007/0262723 A1 | 11/2007 | Ikenouchi | |
| 2008/0029385 A1 | 2/2008 | Koshimizu et al. | |
| 2008/0241016 A1 | 10/2008 | Kato et al. | |
| 2009/0151871 A1 | 6/2009 | Pease et al. | |
| 2009/0255800 A1 | 10/2009 | Koshimizu | |
| 2009/0284156 A1 | 11/2009 | Banna et al. | |
| 2009/0294061 A1 | 12/2009 | Shannon et al. | |
| 2009/0295296 A1 | 12/2009 | Shannon et al. | |
| 2009/0308734 A1 | 12/2009 | Krauss | |
| 2010/0099266 A1 | 4/2010 | Oswald et al. | |
| 2010/0136793 A1 | 6/2010 | Chen et al. | |
| 2010/0248488 A1 | 9/2010 | Agarwal et al. | |
| 2010/0258246 A1 | 10/2010 | Iwakoshi et al. | |
| 2010/0270141 A1 | 10/2010 | Carter et al. | |
| 2010/0332201 A1 | 12/2010 | Albarede et al. | |
| 2011/0031216 A1 | 2/2011 | Liao et al. | |
| 2011/0097901 A1 | 4/2011 | Banna et al. | |
| 2011/0115492 A1 | 5/2011 | Valcore, Jr. et al. | |
| 2011/0118863 A1 | 5/2011 | Valcore, Jr. | |
| 2011/0137446 A1 | 6/2011 | Valcore, Jr. et al. | |
| 2011/0139748 A1 | 6/2011 | Donnelly et al. | |
| 2012/0000887 A1 | 1/2012 | Eto et al. | |
| 2012/0052689 A1 | 3/2012 | Tokashiki | |
| 2012/0073754 A1 | 3/2012 | De la Llera et al. | |
| 2012/0187844 A1 | 7/2012 | Hoffman et al. | |
| 2012/0227484 A1 | 9/2012 | Chen et al. | |
| 2012/0262064 A1 | 10/2012 | Nagarkatti et al. | |
| 2013/0122711 A1 | 5/2013 | Marakbtanov et al. | |
| 2013/0180951 A1 | 7/2013 | Indrakanti et al. | |
| 2014/0062303 A1 | 3/2014 | Hoffman et al. | |
| 2014/0066838 A1 | 3/2014 | Hancock | |

(56) References Cited

U.S. PATENT DOCUMENTS

| 2014/0076713 A1 | 3/2014 | Valcore, Jr. et al. |
|---|---|---|
| 2014/0305589 A1 | 10/2014 | Valcore, Jr. et al. |
| 2015/0002018 A1 | 1/2015 | Lill et al. |

FOREIGN PATENT DOCUMENTS

| JP | 2002-063999 | | 2/2002 |
|---|---|---|---|
| JP | 2003-282545 | | 10/2003 |
| JP | 2004239211 | A | 8/2004 |
| JP | 2004-335594 | A | 11/2004 |
| JP | 2005130198 | | 5/2005 |
| JP | 2005284046 | A | 10/2005 |
| KR | 10-2005-0088438 | A | 9/2005 |
| KR | 10-2005-0089995 | A | 9/2005 |
| KR | 10-2007-0031915 | A | 3/2007 |
| WO | 9914699 | A1 | 3/1999 |
| WO | 2008002938 | A2 | 1/2008 |
| WO | 2012054306 | A2 | 4/2012 |
| WO | 2014070838 | A1 | 5/2014 |

OTHER PUBLICATIONS

Christoph Steuer, Tool Comparison at GC Stack Etch in LAM TCP Using Plasma Parameters (SEERS), Dec. 12, 2000, 2nd workshop on self excited electron plasma resonance spectroscopy, Dresden, Germany.

Thorsten, Lill et al, "Controlling Ion Energy Within a Plasma Chamber", U.S. Appl. No. 13/930,138, filed Jun. 28, 2013.

"Electromagnetic Waves and Antennas", Sophocles J. Orfanidis, Rutgers University, Aug. 25, 2013, Chapter 10.10.

Damon et al., "Synchronous Pulsed Plasma for Silicon Etch Applications", ECS Transactions, 27 (1) pp. 717-723 (2010), Publication by: The Electrochemical Society.

PCT/US2010/057478 International Search Report and Written Opinion, mailed Jul. 26, 2011 (6 pages).

PCT/US2011/063422 International Search Report and Written Opinion, mailed Mar. 28, 2012 (9 pages).

PCT/US2010/057450 International Search Report and Written Opinion, mailed Jul. 18, 2011 (9 pages).

PCT/IB2013/051010 International Search Report and Written Opinion, mailed Jul. 3, 2013 (13 pages).

* cited by examiner

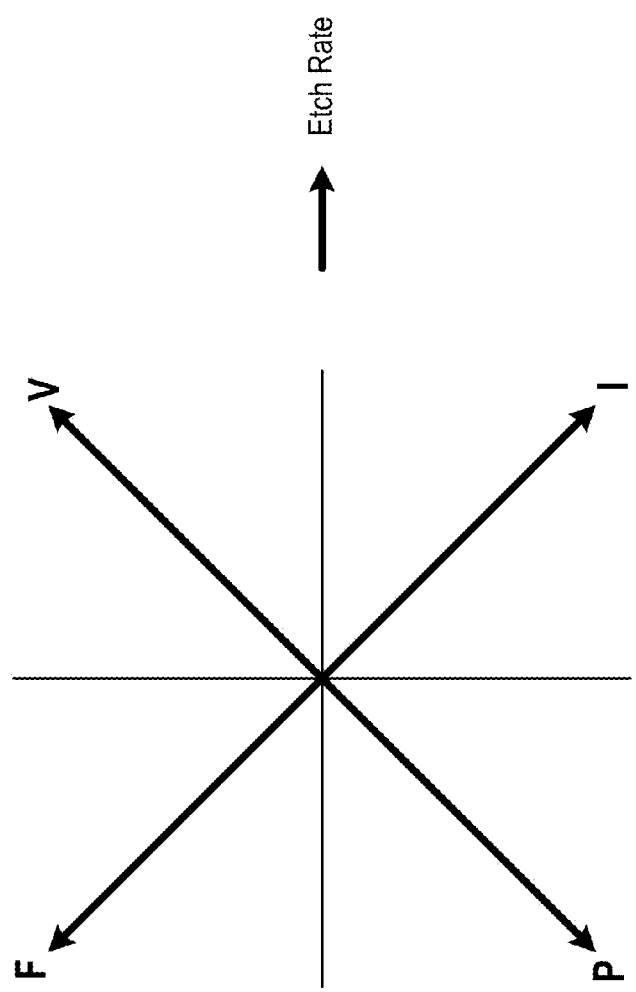

ETCH RATE MODELING AND USE THEREOF WITH MULTIPLE PARAMETERS FOR IN-CHAMBER AND CHAMBER-TO-CHAMBER MATCHING

CLAIM OF PRIORITY

The present patent application claims the benefit of and priority, under 35 U.S.C. §119(e), to U.S. Provisional Patent Application No. 61/858,985, filed on Jul. 26, 2013, and titled "Etch Rate Modeling and Use Thereof For In-chamber and Chamber-to-Chamber Matching", which is incorporated by reference herein in its entirety for all purposes.

FIELD

The present embodiments relate to etch rate modeling and use of the model with multiple parameters for in-chamber matching and chamber-to-chamber matching.

BACKGROUND

Plasma chambers are used for a variety of processes, e.g., cleaning a wafer, depositing materials on a wafer, etc. Plasma is used to perform the processes. For example, a radio frequency (RF) generator generates an RF signal to transfer to a plasma chamber to generate plasma within the plasma chamber. The RF generator may be a 2 megahertz (MHz) RF generator, a 27 MHz RF generator, or a 60 MHz RF generator.

Another one of the processes includes etching a wafer. However, when a wafer is etched in a plasma chamber, rate of etching the wafer varies over time within the plasma chamber. For example, there is an 0.85% etch rate change when the 27 MHz RF generator is used to supply RF power to a plasma chamber to etch a wafer. As another example, there is a 1.08% etch rate change when the 60 MHz RF generator is used to supply RF power to a plasma chamber to etch a wafer.

Moreover, when a wafer is etched in multiple plasma chambers, different etch rates may be applied on the wafer. For example, there may be a 3.3% variability in etch rate chamber-to-chamber when the 27 MHz RF generator is used to supply RF power to plasma chambers to etch a wafer. As another example, there may be a 4.8% variability in an etch rate chamber-to-chamber when the 60 MHz RF generator is used to supply RF power to plasma chambers to etch a wafer.

It is in this context that embodiments described in the present disclosure arise.

SUMMARY

Embodiments of the disclosure provide apparatus, methods and computer programs for etch rate modeling and use of the model with multiple parameters for in-chamber matching and chamber-to-chamber matching. It should be appreciated that the present embodiments can be implemented in numerous ways, e.g., a process, an apparatus, a system, a device, or a method on a computer-readable medium. Several embodiments are described below.

In some embodiments, an etch rate is modeled to facilitate chamber-to-chamber matching and/or in-chamber matching of etch rates. For example, an etch rate is determined as a function of coefficients and power and/or voltage and/or current and/or frequency. The determined etch rate is used to maintain a constant etch rate for a plasma system or across multiple plasma systems.

In various embodiments, a method for performing chamber-to-chamber matching of etch rates based on a model etch rate is described. The method includes receiving a voltage and current measured at an output of a radio frequency (RF) generator of a first plasma system and calculating a first model etch rate based on the voltage and current, and a power. The power is calculated based on the voltage and current and a phase between the voltage and current. The model etch rate is associated with the first plasma system. The method further includes receiving a voltage and current measured at an output of an RF generator of a second plasma system, determining a second model etch rate based on the voltage and current at the output of the RF generator of the second plasma system, and comparing the second model etch rate with the first model etch rate. The method includes adjusting a power at the output of the RF generator of the second plasma system to achieve the first model etch rate associated with the first plasma system upon determining that the second model etch rate does not match the first model etch rate. The method is executed by a processor.

In several embodiments, a method for performing in-chamber matching of etch rates based on a model etch rate is described. The method includes receiving a voltage and current measured at a first time at an output of an RF generator of a plasma system and calculating a first model etch rate based on the voltage, the current, and a power. The power is calculated based on a phase between the voltage and the current. The method further includes receiving a voltage and a current measured at a second time at the output of the RF generator and calculating a second model etch rate based on the voltage, the current, and a power. The power is calculated based on a phase between the voltage and the current measured at the second time. The method includes comparing the first model etch rate with the second model etch rate and adjusting power at the output of the RF generator to achieve the first model etch rate upon determining that the second model etch rate does not match the first model etch rate. The method is executed by a processor.

In some embodiments, a first plasma system is described. The first plasma system includes an RF generator for generating an RF signal. The RF generator includes an output for facilitating transfer of the RF signal. The first plasma system further includes a complex impedance sensor coupled to the output for measuring a voltage and current of the RF signal and an impedance matching circuit coupled to the RF generator via a cable and coupled to the plasma chamber via an RF transmission line for modifying the RF signal to generate a modified RF signal. The first plasma system includes a plasma chamber for generating plasma when the modified RF signal is received from the impedance matching circuit. The first plasma system includes a processor coupled to the complex impedance sensor for receiving the voltage and current measured at the output of the RF generator. The processor is used for calculating a first model etch rate based on the voltage and current, and a power. The power is calculated based on the voltage and current and a phase between the voltage and current. The processor is used for receiving a voltage and current measured at an output of an RF generator of a second plasma system, determining a second model etch rate based on the voltage and current at the output of the RF generator of the second plasma system, and comparing the second model etch rate with the first model etch rate. The processor is used for adjusting a power at the output of the RF generator of the first plasma system to achieve the first model etch rate upon determining that the second model etch rate does not match the first model etch rate.

Some advantages of the above-described embodiments include providing a model of an etch rate. For example, an etch rate model is determined as a function of coefficients and power and/or voltage and/or current and/or frequency. The model is feasible and uses less computation time of a processor and less resources, e.g., number of processors and/or memory devices. Moreover, it is not necessary to use an etch rate measurement device (ERMD) to measure an etch rate to achieve etch rate uniformity in-chamber or chamber-to-chamber. Also, the in-chamber or chamber-to-chamber uniformity in etch rates provides a certainty in etch rates independent of a time at which RF power is supplied by an RF generator in a plasma system to etch a wafer.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 1 is a diagram used to illustrate that a model etch rate is a function of power, frequency, voltage, and current, in accordance with some embodiments described in the present disclosure.

DETAILED DESCRIPTION

The following embodiments describe systems and methods for chamber matching using a power control mode. It will be apparent that the present embodiments may be practiced without some or all of these specific details. In other instances, well known process operations have not been described in detail in order not to unnecessarily obscure the present embodiments.

FIG. 1 is a diagram used to illustrate that a model etch rate is a function of a voltage and/or current and/or power and/or frequency. In some embodiments, an etch rate is measured in terms of nanometers per minute. The voltage is measured at an output of a radio frequency (RF) generator. The current is measured at the output of the RF generator, the power is measured the output of the RF generator, and the frequency is measured at the output of the RF generator.

When one or more of the voltage, the current, the power, and the frequency is changed, the model etch rate changes.

In some embodiments, the voltage is a voltage magnitude, the current is a current magnitude, and the power is a power magnitude. Examples of a magnitude includes a zero-to-peak magnitude, a peak-to-peak magnitude, and a root mean square (RMS) magnitude.

In various embodiments, the power is delivered power, which is a difference between power supplied by the RF generator to a plasma chamber and power that is reflected by the plasma chamber towards the RF generator. In some embodiments, the power is supplied power or reflected power.

Figure 2A:
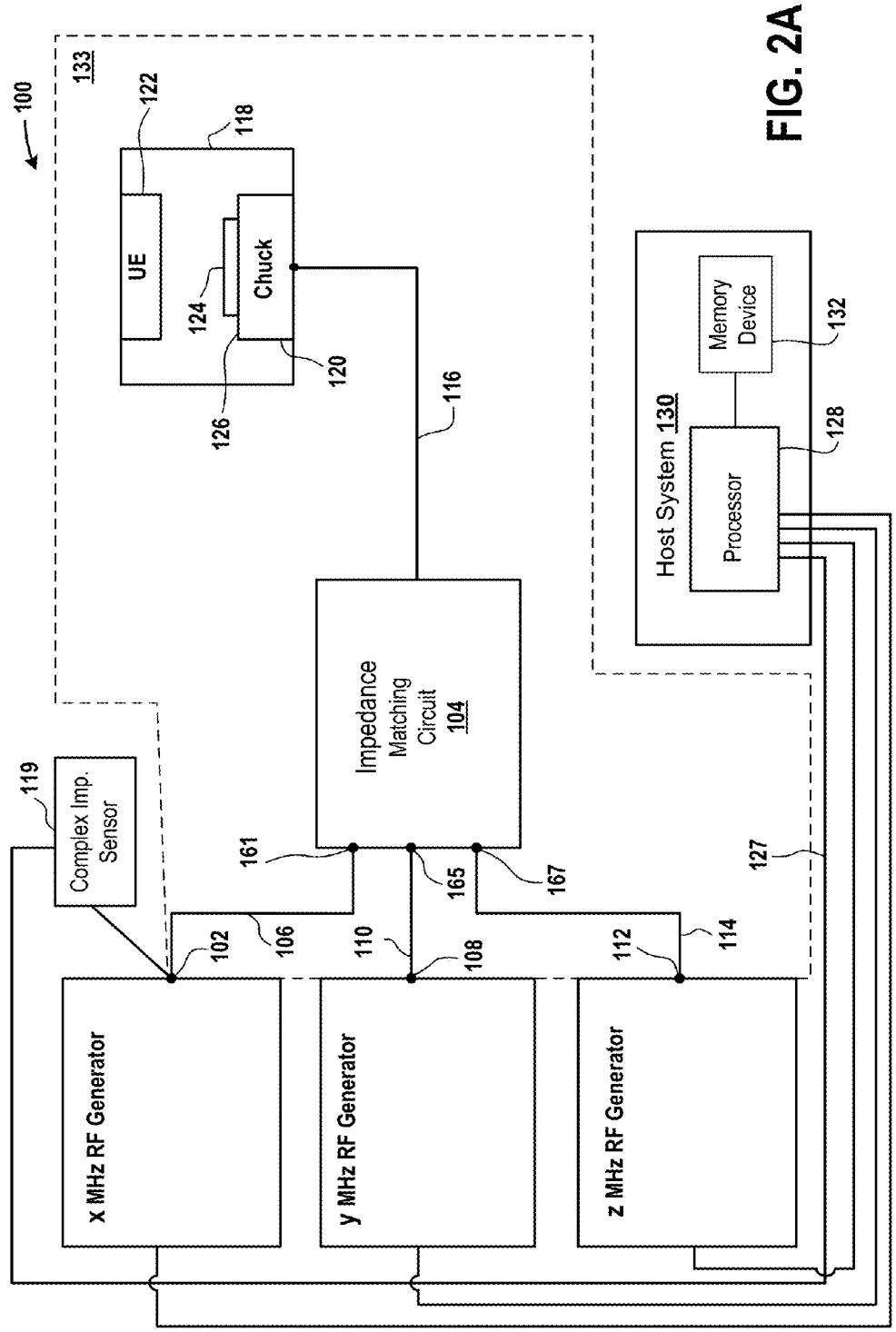
FIG. 2A is a diagram of an embodiment of a plasma system used to determine a model etch rate, in accordance with some embodiments described in the present disclosure.

FIG. 2A is a diagram of an embodiment of a plasma system 100 used to determine a model etch rate. The plasma system 100 includes an x megahertz (MHz) radio frequency (RF) generator, a y MHz RF generator, and a z MHz RF generator. Examples of x MHz include 2 MHz, 27 MHz, and 60 MHz. Examples of y MHz include 2 MHz, 27 MHz, and 60 MHz. Examples of z MHz include 2 MHz, 27 MHz, and 60 MHz.

In some embodiments, the x MHz is different than y MHz and z MHz, and y MHz is different than z MHz. For example, when x MHz is 2 MHz, y MHz is 27 MHz and z MHz is 60 MHz.

It should be noted that in some embodiments, a complex impedance sensor connected to an output of an RF generator is calibrated to a level of accuracy. For example, a complex impedance sensor 119 coupled to an output 102 of the x MHz RF generator measures the same amount of voltage, the same amount of current, and/or the same amount of phase every time the measurement is taken at the output 102. As another example, every time a measurement is taken at the output 102, the complex impedance sensor 119 measures an amount of voltage that is within a threshold of a measurement of the voltage at the output 102 and/or measures an amount of current at the output 102 that is within a threshold of a measurement of the current at the output 102 and/or measures a phase at the output 102 that is within a threshold of a measurement of the phase at the output 102.

In some embodiments, another complex impedance sensor (not shown) is coupled to the output 108 and yet another complex impedance sensor (not shown) is coupled to the output 112.

It should be noted in a variety of embodiments, a phase is a phase between a voltage and a current. For example, when a voltage is $V_m$ volts and current is $I_m$ amperes, a phase between the voltage and current is $\phi_m$ degrees, where m is an integer greater than zero.

In various embodiments, a complex impedance sensor that is calibrated follows a pre-set standard, e.g., a National Institute of Standards and Technology (NIST) standard. For example, a calibrated complex impedance sensor used connected to an output of an RF generator is NIST traceable.

In a number of embodiments, any number of RF generators, e.g., two, four, etc., are used within the plasma system 100.

An impedance matching circuit 104 is coupled to the output 102 via an RF cable 106. Similarly, the impedance matching circuit 104 is coupled to an output 108 of the y MHz RF generator via an RF cable 110 and the impedance matching circuit 104 is coupled to an output 112 of the z MHz RF generator via an RF cable 114. The impedance matching circuit 104 matches an impedance of a load coupled to the impedance matching circuit 104 at one side with an impedance of a source coupled to the impedance matching circuit 104 at another side. For example, the impedance matching circuit 104 matches an impedance an RF transmission line 116 and a plasma chamber 118 with an impedance of the x MHz RF generator, the y MHz RF generator, the z MHz RF generator, the RF cable 106, the RF cable 110, and the RF cable 114.

The plasma chamber 118 is coupled to the impedance matching circuit 104 via the RF transmission line 116. The plasma chamber 118 includes a chuck 120, an upper electrode 122, and other parts (not shown), e.g., an upper dielectric ring surrounding the upper electrode 122, an upper electrode extension surrounding the upper dielectric ring, a lower dielectric ring surrounding a lower electrode of the chuck 120, a lower electrode extension surrounding the lower dielectric ring, an upper plasma exclusion zone (PEZ) ring, a lower PEZ ring, etc. The upper electrode 122 is located opposite to and facing the chuck 120. A dummy wafer 124 is supported on an upper surface 126 of the chuck 120. Each of the lower electrode and the upper electrode 122 is made of a metal, e.g., aluminum, alloy of aluminum, copper, etc. The chuck 120 may be an electrostatic chuck (ESC) or a magnetic chuck.

In some embodiments, the dummy wafer 124 is used to determine an etch rate. For example, the dummy wafer 124 is made of a material other than a semiconductor. Examples of materials other than a semiconductor include glass, sodalime, borosilicate, quartz, ceramic, carbon fiber, etc. As another example, the dummy wafer 124 is cheaper than a semiconductor wafer.

In some embodiments, a semiconductor wafer is used instead of the dummy wafer 124. Various processes, e.g., chemical vapor deposition, cleaning, deposition, sputtering, etching, ion implantation, resist stripping, etc., are performed on the semiconductor wafer during production. Integrated circuits, e.g., application specific integrated circuit (ASIC), programmable logic device (PLD), etc. are developed on the semiconductor wafer and the integrated circuits are used in a variety of electronic items, e.g., cell phones, tablets, smart phones, computers, laptops, networking equipment, etc.

The RF cables 106, 110, 114, the impedance matching circuit 104, the RF transmission line 116, and the plasma chamber 118 are parts of a tool 133 of the plasma system 100.

In some embodiments, the upper electrode 122 includes one or more gas inlets, e.g., holes, etc., that are coupled to a central gas feed (not shown). The central gas feed receives one or more process gases from a gas reservoir (not shown). An example of a process gas includes an oxygen-containing gas, such as $O_2$. Other examples of the process gas include a fluorine-containing gas, e.g., tetrafluoromethane ($CF_4$), sulfur hexafluoride ($SF_6$), hexafluoroethane ($C_2F_6$), etc. The upper electrode 122 is grounded. The chuck 120 is coupled to the x MHz RF generator, the y MHz RF generator, and the z MHz RF generator via the impedance matching circuit 104.

When the process gas is supplied between the upper electrode 122 and the chuck 120 and when the x MHz RF generator and/or the y MHz RF generator and/or the z MHz RF generator supplies RF signals via the impedance matching circuit 104 and the RF transmission line 116 to the chuck 120, the process gas is ignited to generate plasma within the plasma chamber 118.

When the x MHz RF generator generates and provides an RF signal via the output 102, the RF cable 106, the impedance matching circuit 104, and the RF transmission line 116 to the chuck 120 on which the dummy wafer 124 is placed, the complex impedance sensor 119 measures a complex voltage and current at the output 102. In some embodiments, a complex voltage and current includes a voltage magnitude, a current magnitude, and a phase between the voltage magnitude and current magnitude. The complex voltage and current measured by the complex impedance sensor 119 is provided via a cable 127 to a processor 128 of a host system 130 for storage in a memory device 132 of the host system 130. The processor 128 is coupled to the complex impedance sensor 119 via the cable 127.

As used herein, a processor may be a central processing unit (CPU), a microprocessor, an application specific integrated circuit (ASIC), a programmable logic device (PLD), etc. Examples of a memory device include a read-only memory (ROM), a random access memory (RAM), or a combination thereof. A memory device may be a flash memory, a redundant array of storage disks (RAID), a hard disk, etc.

Similarly, the complex impedance sensors (not shown) coupled to the outputs 108 and 112 provides a measurement of a complex voltage and current via corresponding cables to the processor 128 for storage in the memory device 132.

The processor 128 calculates an etch rate associated with the plasma system 100 based on a measurement at a time $t_1$ of a complex voltage and current received from the complex impedance sensor 119. The measurement of the complex voltage and current is generated and received when the x MHz RF generator 162 supplies power via the output 102 to the plasma chamber 118. The processor 128 generates a model etch rate based on the measured complex voltage and current. For example, the processor 128 calculates a sum of a number of terms to determine a model etch rate associated with the plasma system 100. Each term is a product of a coefficient and a function of the voltage measured at the time $t_1$, or a product of a coefficient and a function of the current measured at the time $t_1$, or a product of a coefficient, a function of the voltage measured at the time $t_1$, and a function of the current measured at the time $t_1$. As an example, the processor 128 calculates a model etch rate ER1001 as being equal to $C_{11}V_1+C_{12}I_1$, which is a polynomial of a first order, where each of $C_{11}V_1$ and $C_{12}I_1$ is a term, $C_{11}$ and $C_{12}$ are coefficients, $V_1$ is a voltage magnitude measured by the complex impedance sensor 119 at the time $t_1$, and $I_1$ is a current magnitude measured by the complex impedance sensor 119 at the time $t_1$. As another example, an etch rate ER1002 is calculated as $C_{21}V_1+C_{22}I_1+C_{23}V_1^2+C_{24}V_1I_1+C_{25}I_1^2$, which is a polynomial of a second order, where each of $C_{21}V_1$, $C_{22}I_1$, $C_{23}V_1^2$, $C_{24}V_1I_1$, and $C_{25}I_1^2$ is a term, $C_{21}$, $C_{22}$, $C_{23}$, $C_{24}$, and $C_{25}$ are coefficients, where $I_1^2$ is a function, having a power of 2, of the current $I_1$, where $V_1^2$ is a function, having a power of 2, of the voltage $V_1$. As yet another example, an etch rate ER1003 is calculated as $C_{31}V_1+C_{32}I_1+C_{33}V_1^2+C_{34}V_1I_1+C_{35}I_1^2+C_{36}V_1^3+C_{37}V_1^2I_1+C_{38}V_1I_1^2+C_{39}I_1^3$, which is a polynomial of a third order, where each of $C_{31}V_1$, $C_{32}I_1$, $C_{33}V_1^2$, $C_{34}V_1I_1$, $C_{35}I_1^2$, $C_{36}V_1^3$, $C_{37}V_1^2I_1$, $C_{38}V_1I_1^2$, and $C_{39}I_1^3$ is a term, $C_{31}$, $C_{32}$, $C_{33}$, $C_{34}$, $C_{35}$, $C_{36}$, $C_{37}$, $C_{38}$, and $C_{39}$ are coefficients, $I_1^3$ is a function, having a power of 3, of the current I, and $V_1^3$ is a function, having a power of 3, of the voltage $V_1$. As another example, an etch rate ER1004 is calculated as $C_{41}V_1+C_{42}I_1+C_{43}V_1^2+C_{44}V_1I_1+C_{45}I_1^2+C_{46}V_1^3+C_{47}V_1^2I+C_{48}V_1I_1^2+C_{49}I_1^3+C_{50}V_1^4+C_{51}V_1^3I_1+C_{52}V_1^2I_1^2+C_{53}V_1I_1^3+C_{54}I_1^4$, which is a polynomial of a fourth order, where each of $C_{41}V_1$, $C_{42}I_1$, $C_{43}V_1^2$, $C_{44}V_1I_1$, $C_{45}I_1^2$, $C_{46}V_1^3$, $C_{47}V_1^2I$, $C_{48}V_1I_1^2$, $C_{49}I_1^3$, $C_{50}V_1^4$, $C_{51}V_1^3I_1$, $C_{52}V_1^2I_1^2$, $C_{53}V_1I_1^3$, and $C_{54}I_1^4$ is a term, $C_{41}$, $C_{42}$, $C_{43}$, $C_{44}$, $C_{45}$, $C_{46}$, $C_{47}$, $C_{48}$, $C_{49}$, $C_{50}$, $C_{51}$, $C_{52}$, $C_{53}$, and $C_{54}$ are coefficients, $I_1^4$ is a function, having a power of 4, of the current $I_1$, and $V_1^4$ is a function, having a power of 4, of the voltage $V_1$.

It should be noted that $V_m$ is a voltage magnitude, e.g., a zero-to-peak voltage, a peak-to-peak voltage, a root mean square (RMS) voltage, etc., and $I_m$ is a current magnitude, e.g., a zero-to-peak current, a peak-to-peak current, an RMS current, etc, where "m" is an integer greater than zero. It should be noted that in some embodiments, each of the first order polynomial, the second order polynomial, the third order polynomial, and the fourth order polynomial is a portion of a Taylor series expansion. As an example, the processor 128 calculates an etch rate ER100n as being equal to a Taylor series expansion, which is also an $n^{th}$ order polynomial, of a function of the voltage $V_1$, a function of the current $I_1$, and a coefficient, where n is an integer. To illustrate, the processor 128 calculates the etch rate ER100n as the $n^{th}$ order polynomial that converges to a value, where n is an integer greater than zero.

As yet another example, an etch rate ER1005 is determined as $C_{55}V_1^{e1}+C_{56}P_1^{e2}+C_{57}I_1$, where $C_{55}$, $C_{56}$, and $C_{57}$ are coefficients, e1 and e2 are exponents, $P_1$ is a product of the voltage magnitude $V_1$, the current magnitude $I_1$, and a cosine of an angle $\phi_1$, which is a phase between the current magnitude $I_1$ and the voltage magnitude $V_1$. The power $P_1$ is calculated by the processor 128. As another example, an etch rate ER1006 is determined as $C_{55}V_1^{e1}+C_{56}P_1^{e2}+C_{57}I_1+C_{58}F_1$, where $C_{58}$ is a coefficient, and $F_1$ is a frequency. As another example, an etch rate ER1007 is determined as $C_{55}V_1^{e1}+C_{56}P_1^{e2}+C_{57}I_1^{e3}+C_{58}F_1^{e4}$, where e3 and e4 are exponents. Examples of the exponent e1 include a number ranging from and including 1 to 1.4. Moreover, examples of the exponent e2 include a number ranging from and including 0.5 to 1.

As another example, an etch rate ER1008 is determined as $C_{59}V_1^2+C_{60}I_1^2+C_{61}P_1+C_{62}F_1V_1I_1+C_{63}P_1^2+C_{64}F_1V_1+C_{65}F_1I_1+C_{66}V_1^2I_1+C_{67}I_1^2V_1$, where $C_{59}$, $C_{ho}$, $C_{61}$, $C_{62}$, $C_{63}$, $C_{64}$, $C_{65}$, $C_{66}$, and $C_{67}$ are coefficients. As another example, an etch rate ER1009 is determined as $C_{68}V_1P_1+C_{69}P_1+C_{70}P_1^2+C_{71}P_1I_1+C_{72}P_1I_1^2+C_{73}P_1V_1^2+C_{74}P_1I_1^3+C_{75}P_1V_1^3+C_{76}V_1I_1P_1+C_{77}V_1^2I_1P_1+C_{78}V_1^2+C_{79}I_1^2$, where $C_{68}$, $C_{69}$, $C_{70}$, $C_{71}$, $C_{72}$, $C_{73}$, $C_{74}$, $C_{75}$, $C_{76}$, $C_{77}$, $C_{78}$, and $C_{79}$ are coefficients. In various embodiments, an etch rate is a non-linear function of voltage, is a linear function of current, and is a non-linear function of delivered power.

In some embodiments, a complex impedance sensor includes a frequency sensor that measures the frequency $F_1$ of an RF signal at an output of an RF generator at the time $t_1$. The measured frequency $F_1$ is provided to the processor 128 via a cable to determine an etch rate model.

In various embodiments, a frequency sensor is separate from a complex impedance sensor and is coupled to an output of an RF generator to which the complex impedance sensor is coupled.

In several embodiments, the terms complex impedance sensor and complex voltage and current sensor are used interchangeably.

In various embodiments, a number of terms in an etch rate model ranges from one to a large number, e.g., 100, 1000, 10000, etc. For example, the etch rate ER1001 includes two terms, the etch rate ER1002 includes five terms, the etch rate ER1003 includes nine terms, and the etch rate ER1004 includes 14 terms.

In a number of embodiments, a number of terms used to determine an etch rate model associated with a plasma system is provided as an input by a user via an input device (not shown), e.g., a mouse, a keyboard, a stylus, a touchscreen, etc., that is coupled to the processor 128. In various embodiments, the processor 128 determines a number of terms used to determine an etch rate model associated with a plasma system to achieve convergence in a value of the etch rate model. For example, the processor 128 keeps adding terms used in determining an etch rate model associated with a plasma system until a convergence in the etch rate model is achieved.

In various embodiments, the processor 128 receives coefficients, e.g., the coefficients $C_{11}$, $C_{12}$, $C_{21}$, $C_{22}$, $C_{23}$, $C_{24}$, $C_{25}$, $C_{31}$, $C_{32}$, $C_{33}$, $C_{34}$, $C_{35}$, $C_{36}$, $C_{37}$, $C_{38}$, $C_{39}$, $C_{41}$, $C_{42}$, $C_{43}$, $C_{44}$, $C_{45}$, $C_{46}$, $C_{47}$, $C_{48}$, $C_{49}$, $C_{50}$, $C_{51}$, $C_{52}$, $C_{53}$, $C_{54}$, $C_{55}$, $C_{56}$, $C_{57}$, $C_{58}$, $C_{59}$, $C_{60}$, $C_{61}$, $C_{62}$, $C_{63}$, $C_{64}$, $C_{65}$, $C_{66}$, $C_{67}$, $C_{68}$, $C_{69}$, $C_{70}$, $C_{71}$, $C_{72}$, $C_{73}$, $C_{74}$, $C_{75}$, $C_{76}$, $C_{77}$, $C_{78}$, $C_{79}$, etc., from another processor that determines the coefficients in the same manner in which the processor 128 determines the coefficients. A manner of determining the coefficients is described below.

In some embodiments, the tool 133 provides a higher yield among several tools of several plasma systems. The several tools are of the same or similar type as the tool 133. For example, characteristics, e.g., a resistance, capacitance, inductance, or a combination thereof, etc., of the various corresponding tools is the same as or within a range of a characteristic of the tool 133. As another example, the several tools have the same structure as that of and/or perform the same function as that performed by the tool 133.

In various embodiments, the tool 133 has a higher yield than a tool of another plasma system that is of the same or similar type when the higher yielding tool is used to etch a wafer to achieve a higher aspect ratio than that achieved using the lower yielding tool, or when use of the higher yielding tool results in wafers that are cleaner than those cleaned using the lower yielding tool, or when the higher yielding tool etches at a faster rate than that achieved using the lower yielding tool, or when the higher yielding tool cleans wafers at a faster rate than that achieved using the lower yielding tool, or when the higher yielding tool has a higher rate of processing wafers than that of the lower yielding tool, or a combination thereof.

In various embodiments, the tool 133 is referred to as a golden tool.

In some embodiments, an etch rate associated with the plasma system 100 is maintained constant over time. For example, when there is a variation in the voltage $V_1$ and/or a variation in the current $I_1$ at a time $t_2$, the x MHz RF generator adjusts power delivered via the output 102 of the x MHz RF generator to maintain the etch rate associated with the plasma system 100. The time $t_2$ is after the time $t_1$. The variation in the voltage $V_1$ and/or the variation in the current $I_1$ are received by the processor 128 from the complex impedance sensor 119. As another example, when there is a variation in the voltage $V_1$ and/or a variation in the current $I_1$ at the time $t_2$, the x MHz RF generator adjusts the voltage $V_1$ and/or the current $I_1$ measured at the output 102 of the x MHz RF generator to maintain the etch rate associated with the plasma system 100. As another example, after determining the etch rate ER1001, when there is a change in power of an RF signal supplied by the x MHz RF generator, the x MHz RF generator adjusts the power to achieve the etch rate ER1001. As another example, when there is a fluctuation in power delivered by the x MHz RF generator to the plasma chamber 118, the x MHz RF generator adjusts the power to achieve the etch rate ER1001.

As an example, when there is a variation in the voltage magnitude $V_1$ and/or the current magnitude $I_1$ and/or the frequency $F_1$ at the time $t_2$ used to determine an etch rate, the x MHz RF generator adjusts the power $P_1$, e.g., supplied power, delivered power, reflected power, etc., at its output to maintain as constant the etch rate associated with the plasma system 100. To illustrate, when there is a variation at the time $t_2$ in the voltage magnitude $V_1$ and/or the current magnitude $I_1$ and/or the frequency $F_1$, the x MHz RF generator adjusts the power $P_1$ at the output 102 of the x MHz RF generator to maintain as constant the etch rate ER 1007 associated with the plasma system 100. As another illustration, when there is a variation at the time $t_2$ in the voltage magnitude $V_1$ and/or the current magnitude $I_1$, the x MHz RF generator adjusts the power $P_1$ at the output 102 of the x MHz RF generator to maintain as constant the etch rate ER 1005 associated with the plasma system 100.

As another example, when there is a variation at the time $t_2$ in the voltage magnitude $V_1$ and/or current magnitude $I_1$ and/or the power $P_1$ used to determine an etch rate, the x MHz RF generator tunes the frequency $F_1$ to maintain as constant an etch rate model associated with the plasma system 100. As yet another example, when there is a variation at the time $t_2$ in the voltage magnitude $V_1$ and/or frequency $F_1$ and/or the power $P_1$ used to determine an etch rate model, the x MHz RF generator adjusts the current magnitude $I_1$ to maintain as constant an etch rate model associated with the plasma system 100. As another example, when there is a variation at the time $t_2$ in the current magnitude $I_1$ and/or frequency $F_1$ and/or the power $P_1$ used to determine an etch rate model, the x MHz RF generator tunes the voltage magnitude $V_1$ to maintain as constant an etch rate model associated with the plasma system 100.

As another example, when there is a variation in one or more of the voltage magnitude $V_1$, the current magnitude $I_1$, the frequency $F_1$, and the power $P_1$ at the time $t_2$ used to determine an etch rate model, the x MHz RF generator adjusts one or more of the remaining of power $P_1$ and/or the voltage magnitude $V_1$ and/or the current magnitude $I_1$ and/or the frequency $F_1$ at its output to maintain as constant the etch rate associated with the plasma system 100. To illustrate, when there is a variation in the voltage magnitude $V_1$ and the current magnitude $I_1$ at the time $t_2$ used to determine the etch rate model ER1005, the x MHz RF generator adjusts the remaining of power $P_1$ at its output to maintain as constant the etch rate ER1005 associated with the plasma system 100. As another example, when there is a variation in one or more of the voltage magnitude $V_1$, the current magnitude $I_1$, and the frequency $F_1$ at the time $t_2$ used to determine the etch rate model ER1007, the x MHz RF generator adjusts the power $P_1$ at its output to maintain as constant the etch rate associated with the plasma system 100.

In various embodiments, after determining the etch rate associated with the plasma system 100 using the dummy wafer 124, the dummy wafer 124 is replaced with a semiconductor wafer for etching the semiconductor wafer. One or more of the x, y, and z MHz RF generators supply RF power via the corresponding outputs 102, 108, and 112, via the corresponding RF cables 106, 108, and 114, via the impedance matching circuit 104, via the RF transmission line 116 to the chuck 120 when a semiconductor wafer is placed on the top surface 126 of the chuck 120. When the RF power is supplied by the x MHz RF generator, the complex impedance sensor 119 measures a complex voltage and current at the output 102 at the time $t_2$. In various embodiments, when the RF power is supplied by the x MHz RF generator, a frequency sensor coupled to the output 102 measures a frequency at the output 102 at the time $t_2$.

In some embodiments, the processor 128 of the host system 130 maintains a recipe over time for generating plasma within the plasma chamber 118 during times the etch rate associated with the plasma system 100 is determined and the constant etch rate is maintained. For example, the processor 128 maintains as constant a pressure within the plasma chamber 118 and/or a temperature within the plasma chamber 118 and/or a frequency of the x MHz RF generator and/or a frequency of the y MHz RF generator and/or a frequency of the z MHz RF generator and/or a gap between the upper electrode 122 and the chuck 120 and/or a chemistry of one or more process gases within the plasma chamber 118. As another example, the processor 128 maintains as constant a pressure within the plasma chamber 118 and/or a temperature within the plasma chamber 118 and/or a gap between the upper electrode 122 and the chuck 120 and/or a chemistry of one or more process gases within the plasma chamber 118. As yet another example, the processor 128 maintains similar pressures within the plasma chamber 118 and/or similar temperatures within the plasma chamber 118 and/or similar frequencies of the x MHz RF generator and/or similar frequencies of the y MHz RF generator and/or similar frequencies of the z MHz RF generator and/or similar gaps between the upper electrode 122 and the chuck 120 and/or similar chemistries of one or more process gases within the plasma chamber 118. As another example, the processor 128 maintains similar pressures within the plasma chamber 118 and/or similar temperatures within the plasma chamber 118 and/or similar gaps between the upper electrode 122 and the chuck 120 and/or similar chemistries of one or more process gases within the plasma chamber 118.

In some embodiments, similar pressures are maintained within the plasma chamber 118 when a first one of the pressures is within a range of a second one of the pressures. In various embodiments, similar temperatures are maintained within the plasma chamber 118 when a first one of the temperatures is within a range of a second one of the temperatures. In various embodiments, similar frequencies of an RF generator are maintained when a first one of the frequencies is within a range of a second one of the frequencies. In some embodiments, similar gaps are maintained within the plasma chamber 118 when a first one of the gaps is within a range of a second one of the gaps. In a variety of embodiments, similar chemistries are maintained within the plasma chamber 118 when an amount of each process gas is maintained within a pre-determined range and/or a combination of types of process gases is maintained within a pre-set range within the plasma chamber 118. In some embodiments, similar chemistries are maintained within the plasma chamber 118 when a combination of types of process gases is maintained within a pre-set range within the plasma chamber 118. Examples of types of a process gas include an oxygen containing gas, a fluorine containing gas, etc. To illustrate a fluorine containing gas is of a different type than an oxygen containing gas. In some embodiments, a first process gas is of a different type than a second process gas when the first process gas includes a chemical element that is not included within the second process gas.

In various embodiments, the processor 128 controls a gas supply valve (not shown) that facilitates supply of a gas from a gas reservoir (not shown) to gas inlets of an upper electrode of a plasma chamber to control pressure within the plasma chamber. For example, the processor 128 controls a driver (not shown), e.g., a transistor, etc., that supplies a current to open or close the valve by an amount to control the supply of the process gas. The control of the supply of the process gas also allows the processor 128 to control the pressure within a plasma chamber in which the gas is supplied.

In several embodiments, the processor 128 controls a number of gas supply valves (not shown) that facilitate supply of a number of process gases from a number of gas reservoirs (not shown) to gas inlets of an upper electrode of a plasma chamber to control gas chemistry within the plasma chamber. For example, the processor 128 controls a driver that supplies a current to open or close a valve by an amount to control an amount of the first process gas that is supplied from a first gas reservoir to gas inlets of the upper electrode 122 and controls another driver that supplies a current to open or close another valve by an amount to control an amount of the second process gas that is supplied from a second gas reservoir to the gas inlets. In various embodiments, the second process gas is different from the first process gas. For example, the first process gas is an oxygen-based process gas and the second process gas is a fluorine-based process gas. As another example, the first process gas is tetrafluoromethane and the second process gas is sulfur hexafluoride.

In some embodiments, a heater is included within a chuck of a plasma chamber and the heater is controlled by the processor 128 via a driver to change temperature within the plasma chamber.

In several embodiments, a heat transfer mechanism, e.g., a duct, etc., is provided within a plasma chamber and a flow of a cooling liquid is controlled by the processor 128 via a valve and a driver to change temperature within the plasma chamber.

In various embodiments, an upper electrode of a plasma chamber is located within an upper structure (not shown) that is may be raised up or down using a motor-driven screw mechanism (not shown). The processor 128 controls the motor-driven screw mechanism via a driver to move the upper structure up or down to change the gap between the upper electrode and a chuck facing the upper electrode.

In some embodiments, the processor 128 sends a signal to a digital signal processor (DSP) of an RF generator via a cable to adjust a power and/or a voltage and/or a current and/or or a frequency to achieve an etch rate. For example, the processor 128 sends a frequency of an RF signal to an RF generator. Upon receiving the signal, a digital signal processor (DSP) of the RF generator sends a power magnitude and/or a frequency and/or a voltage magnitude and/or a current magnitude to a drive and amplifier system (DAS) of the RF generator. For example, a DSP of the RF generator receives the frequency and sends the frequency to a DAS of the RF generator. The DAS of the RF generator generates an RF signal having the power magnitude and/or the frequency and/or the voltage magnitude and/or the current magnitude to achieve the etch rate. The RF signal is supplied via an RF cable and the impedance matching circuit 104 and the RF transmission line 116 to the plasma chamber 118.

It should be noted that in some embodiments, any number of RF generators are used in the plasma system 100.

Figure 2B:
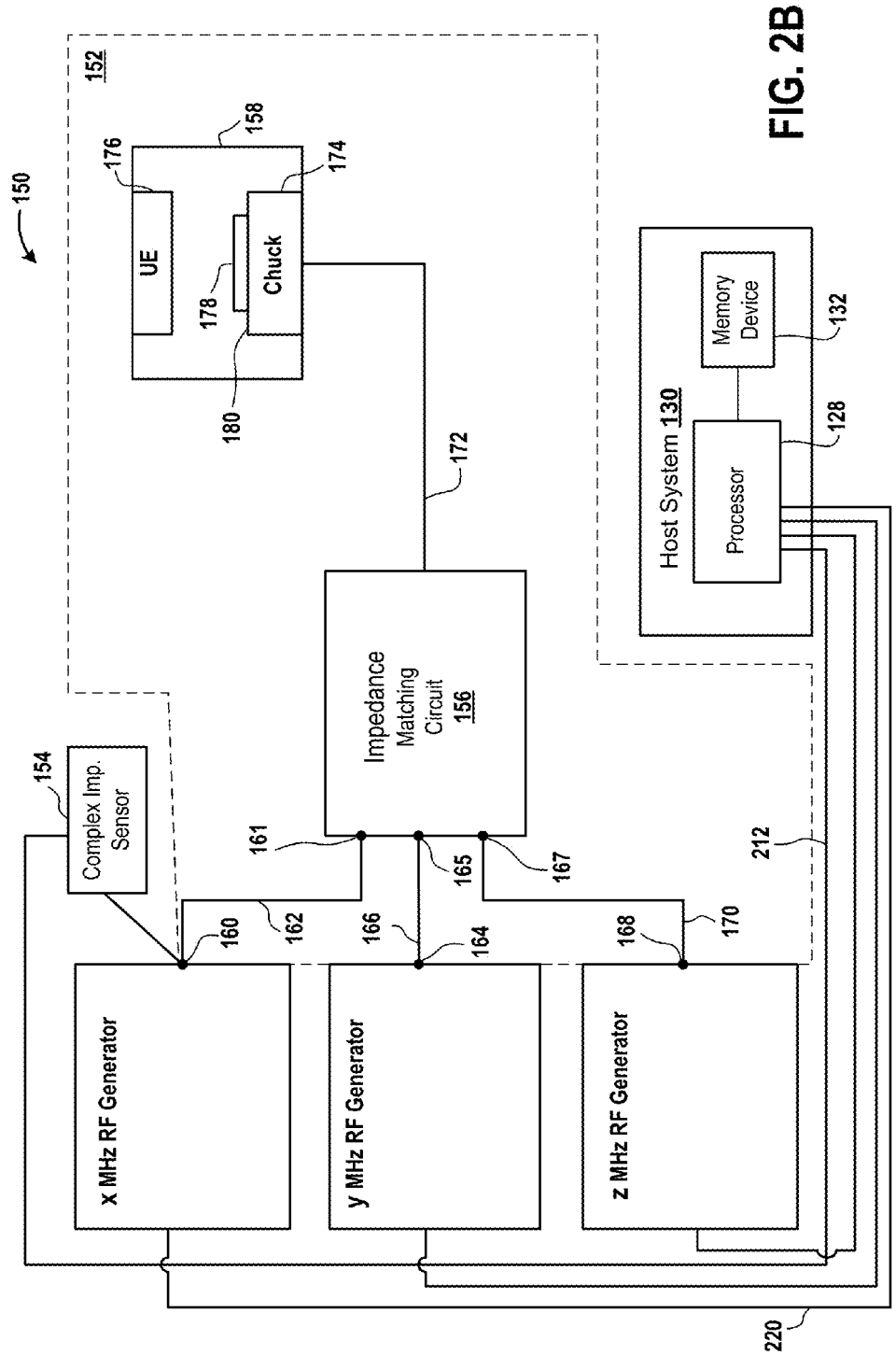
FIG. 2B is a diagram of an embodiment of a plasma system that includes a tool of the same or similar type as that of a tool of the plasma system of FIG. 2A, in accordance with various embodiments described in the present disclosure.

FIG. 2B is a diagram of an embodiment of a plasma system 150 that includes a tool 152 of the same or similar type as that of the tool 133 (FIG. 2A). An etch rate determined using the plasma system 100 (FIG. 2A), e.g., an etch rate determined using power and/or voltage and/or current and/or frequency measured at the time $t_1$, is applied to the plasma system 150 to perform chamber-to-chamber matching of etch rates.

The plasma system 150 includes the x, y, and z MHz RF generators, a complex impedance sensor 154, an impedance matching circuit 156, and a plasma chamber 158. An input 161 of impedance matching circuit 156 is coupled to the output 160 of the x MHz RF generator via an RF cable 162, an input 165 of the impedance matching circuit 156 is coupled to an output 164 of the y MHz RF generator via an RF cable 166, and an input 167 of the impedance matching circuit 156 is coupled to an output 168 of the z MHz RF generator via an RF cable 170. The plasma chamber 158 is coupled to the impedance matching circuit 156 via an RF transmission line 172.

The plasma chamber 158 includes a chuck 174, an upper electrode 176, and other parts, which are described above. The upper electrode 176 is located opposite to and facing the chuck 174 and is grounded. A work piece 178, e.g., a semiconductor wafer, etc., is supported on an upper surface 180 of the chuck 174. Various processes, which are described above, are performed on the work piece 178 during production. Integrated circuits are developed on a work piece and the integrated circuits are used in a variety of electronic items, e.g., cell phones, tablets, smart phones, computers, laptops, networking equipment, etc. Each of the lower electrode of the plasma chamber 158 and the upper electrode 176 is made of a metal, e.g., aluminum, alloy of aluminum, copper, etc. The chuck 174 may be an ESC or a magnetic chuck.

In various embodiments, the plasma chamber 158 has the same structure as that of the plasma chamber 118 (FIG. 2A). For example, the plasma chamber 158 includes structural elements that have same dimensions as that of corresponding structural elements in the plasma chamber 118. As another example of the plasma chambers 118 and 158 having the same structure, the plasma chamber 158 includes elements that are of the same type as that of corresponding structural elements in the plasma chamber 118. To illustrate, a transformer coupled plasma (TCP) chamber has one or more structural elements of a different type than one or more structural elements of an inductively coupled plasma (ICP) chamber and both the TCP and the ICP chambers have one or more structural elements of different types than one or more structural elements of an electron cyclotron resonance (ECR) plasma chamber. As another illustration, a plasma chamber that includes inductors as electrodes is of a different type than a plasma chamber that includes a capacitor as electrodes.

Examples of structural elements of a plasma chamber include an upper electrode, a lower electrode, an upper plasma exclusion zone (PEZ) ring, a lower PEZ ring, a confinement ring assembly, an edge ring, an insulator layer, gas distribution apertures, walls of the plasma chamber, an upper dielectric ring surrounding the upper electrode, an upper electrode extension surrounding the upper dielectric ring, a lower dielectric ring surrounding the lower electrode, a heating element located within the upper electrode or the lower electrode, a cooling element located within the upper electrode or the lower electrode, a lower electrode extension surrounding the lower dielectric ring, etc. In various embodiments, the lower electrode and the lower electrode extension are made of a metal, e.g., anodized aluminum, alloy of aluminum, etc. Also, in some embodiments, the upper electrode and the upper electrode extension are made of a metal, e.g., aluminum, alloy of aluminum, etc. In several embodiments, the upper electrode is located opposite to and facing the lower electrode and the upper electrode extension is located opposite to and facing the upper electrode.

Examples of dimensions of a structural element include a size of the element, a length of the element, a depth of the element, a width of the elements, a surface area of the element, a volume occupied by the element, etc.

Examples of structural elements of different types include a plate electrode, an electric coil electrode, etc.

In various embodiments, the plasma chamber 158 is structurally identical to plasma chamber 118 and has a different identification code than that of the plasma chamber 118. For example, an entity identifies the plasma chamber 158 using an identity code aaaa and the entity identifies the plasma chamber 118 using an identity code bbbb.

In a number of embodiments, the plasma chamber 158 is structurally identical to the plasma chamber 118 and is used to perform the same function as that of the plasma chamber 118. As an example of the same function, the plasma chamber 158 has similar characteristics, e.g., capacitance, resistance, inductance, a combination thereof, etc., to that of the plasma chamber 118. To illustrate, the plasma chamber 158 has an inductance within a range of inductance of the plasma chamber 118. As another illustration, the plasma chamber 158 has a capacitance that is within a range of capacitance of the plasma chamber 118. As yet another illustration, the plasma chamber 158 has a resistance within a range of a resistance of the plasma chamber 118. As another illustration, the plasma chamber 158 has a combination of inductance, resistance, and capacitance that is within a range of combination of inductance, resistance, and capacitance of the plasma chamber 118. Examples of a function performed by a plasma chamber include physical vapor deposition (PVD), chemical vapor deposition (CVD), plasma-enhanced CVD (PECVD), metal CVD, a high-density plasma CVD (HDP-CVD) function, a photoresist strip function, a photoresist surface preparation, ultraviolet thermal processing (UVTP), etc.

In various embodiments, the plasma chamber 158 is structurally and functionally identical to plasma chamber 118 and has a different identification code than that of the plasma chamber 118.

Moreover, in various embodiments, the RF transmission line 172 is structurally and/or functionally identical to the RF transmission line 116 (FIG. 2A). An RF transmission line is described further in FIG. 3.

Figure 3:
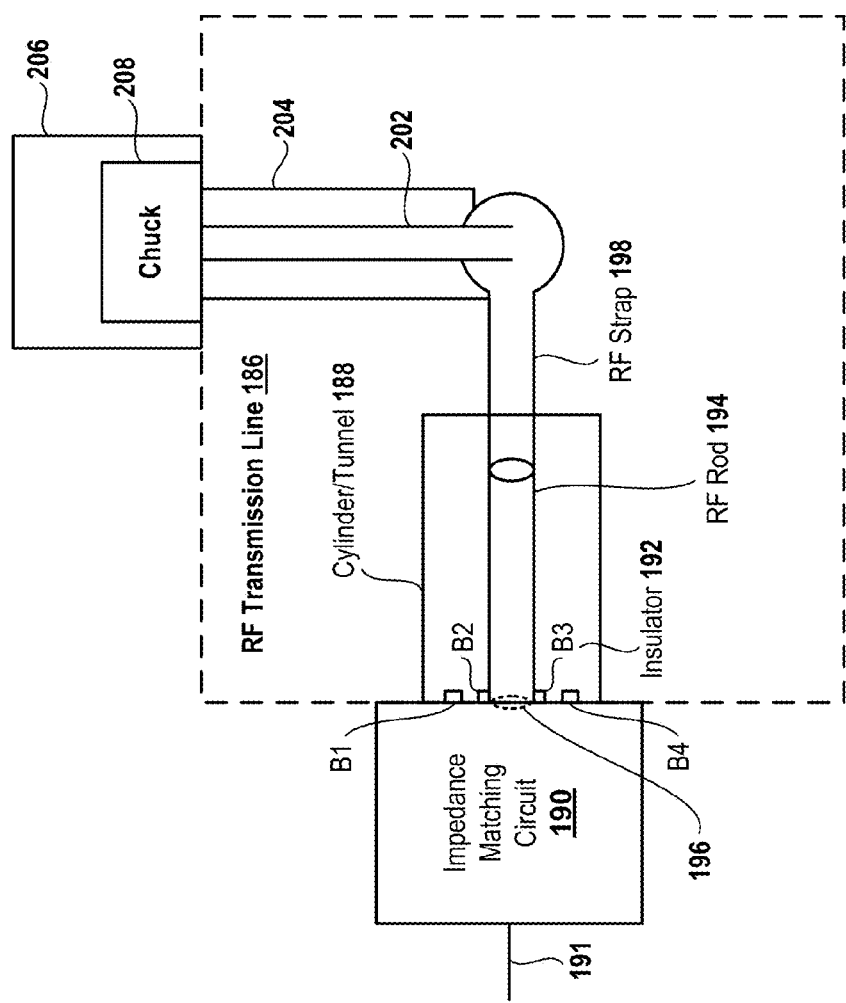
FIG. 3 is a diagram of an embodiment of a structure of a radio frequency (RF) transmission line, in accordance with several embodiments described in the present disclosure.

FIG. 3 is a diagram of an embodiment of a structure of an RF transmission line 186, which is an example of the RF transmission line 116 (FIG. 2A) or the RF transmission line 172 (FIG. 2B). The RF transmission line 186 includes a cylinder 188, e.g., a tunnel, etc., that is bolted to an impedance matching circuit 190, which is an example of the impedance matching circuit 104 (FIG. 2A) or the impedance matching circuit 156 (FIG. 2B). The impedance matching circuit 190 is coupled with an RF cable 191, which is an example of the RF cable 106 (FIG. 2A) or the RF cable 162 (FIG. 2B). Within a hollow of the cylinder 188 lies an insulator 192 and an RF rod 194.

The RF transmission line 186 is bolted via bolts B1, B2, B3, and B4 to the impedance matching circuit 190. In one embodiment, the RF transmission line 186 is bolted via any number of bolts with the impedance matching circuit 190. In some embodiments, instead of or in addition to bolts, any other form of attachment, e.g., glue, screws, etc., is used to attach the RF transmission line 186 to the impedance matching circuit 190.

The RF transmission rod 194 is coupled with an output 196 of the impedance matching circuit 190. Also, an RF strap 198, also known as RF spoon, is coupled with the RF transmission rod 194 and with an RF rod 202, a portion of which is located within a support 204, e.g., a cylinder. In an embodiment, a combination of the cylinder 188, the RF strap 198, the support 204 and the RF rod 202 forms the RF transmission line 186. The support 204 provides support to a plasma chamber 206, which is an example of the plasma chamber 118 (FIG. 2A) or the plasma chamber 158 (FIG. 2B). The support 204 is attached to a chuck 208 of the plasma chamber 206. The chuck 208 is an example of the chuck 120 (FIG. 2A) or the chuck 174 (FIG. 2B). An RF signal is supplied from an RF generator via the RF cable 191, the impedance matching circuit 190, the RF rod 194, the RF strap 198, and the RF rod 202 to the chuck 208.

Referring back to FIG. 2B, in some embodiments, the RF transmission line 172 is structurally identical to the RF transmission line 116 (FIG. 2A). For example, the RF transmission line 172 includes identical elements as that of the RF transmission line 116. Examples of elements of an RF transmission line include an RF rod that is coupled to an impedance matching circuit, a cylinder that surrounds the RF rod, an RF spoon, an RF rod that is coupled to the RF spoon and to a chuck, and a cylinder that surrounds at least a portion of the RF rod.

In various embodiments, the RF transmission line 172 is structurally identical to the RF transmission line 116 and has different identification code than that of the RF transmission line 116.

In a number of embodiments, the RF transmission line 172 is functionally identical to the RF transmission line 116. For example, the RF transmission line 172 has similar characteristics to that of the RF transmission line 116. To illustrate, the RF transmission line 172 has an inductance within a range of inductance of the RF transmission line 116. As another illustration, RF transmission line 172 has a capacitance that is within a range of capacitance of the RF transmission line 116. As yet another illustration, the RF transmission line 172 has a resistance within a range of a resistance of the RF transmission line 116. As another illustration, RF transmission line 172 has a combination of inductance, resistance, and capacitance that is within a range of combination of inductance, resistance, and capacitance of the RF transmission line 116.

In some embodiments, the RF transmission line 172 is functionally identical to the RF transmission line 116 and has different identification code than that of the RF transmission line 116.

In some embodiments, the RF transmission line 172 is structurally and functionally identical to the RF transmission line 116 and has different identification code than that of the RF transmission line 116.

Similarly, in some embodiments, the impedance matching circuit 156 has the same structure as that of the impedance matching circuit 104 (FIG. 2A). For example, the impedance matching circuit 156 has the same number of capacitors as that of the impedance matching circuit 104 and/or the same number of inductors as that of the impedance matching circuit 104. Also, in this example, the capacitors in both the impedance matching circuits 104 and 156 are connected with each other in the same manner, e.g., serial, parallel, etc. Moreover, in this example, the inductors in both the impedance matching circuits 104 and 156 are connected with each other in the same manner, e.g., serial, parallel, etc.

In various embodiments, the impedance matching circuit 156 is structurally identical to the impedance matching circuit 104 and has a different identification code than that of the impedance matching circuit 104.

In several embodiments, the impedance matching circuit 156 performs the same function as that performed by the impedance matching circuit 104. For example, the impedance matching circuit 156 has similar characteristics to that of the impedance matching circuit 104. To illustrate, the impedance matching circuit 156 has an inductance within a range of inductance of the impedance matching circuit 104. As another illustration, the impedance matching circuit 156 has a capacitance that is within a range of capacitance of the impedance matching circuit 104. As another illustration, impedance matching circuit 156 has a combination of inductance and capacitance that is within a range of combination of inductance and capacitance of the impedance matching circuit 104.

In various embodiments, the impedance matching circuit 156 performs the same function as that performed by the impedance matching circuit 104 and has different identification code than that of the impedance matching circuit 104.

In various embodiments, the impedance matching circuit 156 has the same structure and performs the same function as that performed by the impedance matching circuit 104, and has different identification code than that of the impedance matching circuit 104.

The RF cable 162 is structurally the same as that of the RF cable 106 (FIG. 2A). For example, each RF cable 162 and RF cable 106 includes a conductor, which is surrounded by an insulator. As another example, the RF cable 162 has the same dimensions, e.g., length, diameter, etc., as that of the RF cable 106.

In some embodiments, the RF cable 162 has the same structure as that of the RF cable 106 and has a different identification code than that of the RF cable 106.

In various embodiments, the RF cable 162 performs the same function as that of the RF cable 106. For example, the RF cable 162 has similar characteristics to that of the RF cable 106. To illustrate, the RF cable 162 has a resistance within a range of a resistance of the RF cable 106 and/or has a capacitance within a range of a capacitance of the RF cable 106 and/or has an inductance within a range of an inductance of the RF cable 106.

In several embodiments, the RF cable 162 performs the same function as that performed by the RF cable 106 and has a different identification code than that of the RF cable 106.

In a number of embodiments, the RF cable 162 has the same structure and performs the same function as that of the RF cable 106, and has a different identification code than that of the RF cable 106.

Similarly, the RF cable 166 has the same structure as that of the RF cable 110 (FIG. 2A) and/or performs the same function as that of the RF cable 110 and/or has a different identification code than that of the RF cable 110. Moreover, the RF cable 170 has the same structure as that of the RF cable 114 (FIG. 2A) and/or performs the same function as that of the RF cable 114 and/or has a different identification code than that of the RF cable 114.

The RF cables 162, 164, 170, the impedance matching circuit 156, the RF transmission line 172, and the plasma chamber 158 are parts of the tool 152 of the plasma system 150.

In various embodiments, the tool 133 (FIG. 2A), which is a golden tool, provides a higher yield than that provided by the tool 152.

The x MHz RF generator generates and supplies RF power via the output 160, the RF cable 162, the impedance matching circuit 156, and the RF transmission line 172 to the chuck 174 on which the wafer 178 is placed for etching. Moreover, the y MHz RF generator generates and supplies RF power via the output 164, the RF cable 166, the impedance matching circuit 156, and the RF transmission line 172 to the chuck 174. Also, the z MHz RF generator generates and supplies RF power via the output 168, the RF cable 170, the impedance matching circuit 156, and the RF transmission line 172 to the chuck 174. When a process gas is supplied from a gas supply via a gas feed and gas inlets of the upper electrode 176 to a space between the upper electrode 176 and the chuck 174 and the chuck 174 receives RF power from RF signals supplied by the x and/or y and/or z MHz RF generators, the process gas is ignited to generate plasma within the plasma chamber 158.

The complex impedance sensor 154 measures a voltage magnitude, a current magnitude, and a phase between the voltage magnitude and current magnitude when RF signal is supplied by the x MHz RF generator via the output 160. Similarly, another complex impedance sensor (not shown) coupled to the output 164 measures a voltage magnitude, a current magnitude, and a phase between the voltage magnitude and the current magnitude when RF signal is supplied by the y MHz RF generator via the output 164. Also, a complex impedance sensor (not shown) coupled to the output 168 measures a voltage magnitude, a current magnitude, and a phase between the voltage magnitude and the current magnitude when RF signal is supplied by the z MHz RF generator via the output 168.

In some embodiments, a frequency sensor that is coupled to an output of an RF generator of the plasma system 150 measures a frequency of an RF signal that is supplied by the RF generator via the output to the impedance matching circuit 156. In various embodiments, the frequency sensor connected to an output of an RF generator of the plasma system 150 is integrated within a complex impedance sensor that is connected to the output.

The processor 128 that is coupled to the complex impedance sensor 154 via a cable 212 receives via the cable 212 the complex voltage and current measured by the complex impedance sensor 154 and/or frequency that is measured by a frequency sensor connected to the output 160, receives the complex voltage and current measured by the complex impedance sensor coupled to the output 164 and/or frequency that is measured by a frequency sensor connected to the output 164, and receives the complex voltage and current measured by the complex impedance sensor coupled to the output 168 and/or frequency that is measured by a frequency sensor connected to the output 168.

The processor 128 determines an etch rate associated with the plasma system 150 based on the complex voltage and current received from the complex impedance sensor 154 and/or based on a frequency received from a frequency sensor. For example, the processor 128 determines an etch rate associated with the plasma system 150 in a manner similar to that of determining an etch rate associated with the plasma system 100. As another example, the processor 128 determines an etch rate ER1501 as being equal to $C_{11}V_2+$ $C_{12}I_2$, where $V_2$ is a voltage magnitude measured by the complex impedance sensor 154 and $I_2$ is a current magnitude measured by the complex impedance sensor 154. As another example, an etch rate ER1502 is calculated as $C_{21}V_2+C_{22}I_2+C_{23}V_2^2+C_{24}V_2I_2+C_{25}I_2^2$. As yet another example, an etch rate ER1503 is calculated as $C_{31}V_2+C_{32}I_2+C_{33}V_2^2+C_{34}V_2I_2+C_{35}I_2^2+C_{36}V_2^3+C_{37}V_2^2I_2+C_{38}V_2I_2^2+C_{39}I_2^3$. As another example, an etch rate ER1504 is calculated as $C_{41}V_2+C_{42}I_2+C_{43}V_2^2+C_{44}V_2I_2+C_{45}I_2^2+C_{46}V_2^3+C_{47}V_2^2I_2+C_{48}V_2I_2^2+C_{49}I_2^3+C_{50}V_2^4+C_{51}V_2^3I_2+C_{52}V_2^2I_2^2+C_{53}V_2I_2^3+C_{54}I_2^4$. AS another example, the processor 128 calculates an etch rate ER150n as being equal to a Taylor series expansion, which is also an $n^{th}$ order polynomial, where n is an integer. To illustrate, the processor 128 calculates the etch rate 150n as the $n^{th}$ order polynomial that converges to a value.

As another example, the processor 128 determines an etch rate ER1505 as being equal to $C_{55}V_2^{e1}+C_{56}P_2^{e2}+C_{57}I_2$, where the power $P_2$ is a multiplication of the voltage magnitude $V_2$, the current magnitude $I_2$, and a phase $\phi_2$ between the voltage magnitude $V_2$ and the current magnitude $I_2$. The power $P_2$ is calculated by the processor 128. As yet another example, an etch rate ER1506 is calculated as $C_{55}V_2^{e1}+C_{56}P_2^{e2}+C_{57}I_2+C_{58}F_2$, where $F_2$ is a frequency that is measured by a frequency sensor that is coupled to the output 160 of the x MHz RF generator. In some embodiments, the frequency sensor that is coupled to the output 160 is integrated within the complex impedance sensor 154. In various embodiments, the frequency sensor connected to the output 160 is separate from and outside the complex impedance sensor 154. The frequency $F_2$ is received by the processor 128 via a cable that is coupled to the frequency sensor connected to the output 160.

As yet another example, an etch rate ER1507 is calculated as $C_{55}V_2^{e1}+C_{56}P_2^{e2}+C_{57}I_2+C_{58}F_2$. As another example, an etch rate ER1508 is determined as $C_{59}V_2^2+C_{60}I_2^2+C_{61}P_2+C_{62}F_2V_2I_2+C_{63}P_2^2+C_{64}F_2V_2+C_{65}F_2I_2+C_{66}V_2^2I_2+C_{67}I_2^2V_2$. As another example, an etch rate ER1509 is determined as $C_{68}V_2P_2+C_{69}P_2I_2+C_{70}P_2^2+C_{71}P_2I_2+C_{72}P_2I_2^2+C_{73}P_2V_2^2+C_{74}P_2I_2^3+C_{75}P_2V_2^3+C_{76}V_2I_2P_2+C_{77}V_2^2I_2P_2+C_{78}V_2^2+C_{79}I_2^2$.

The processor 128 compares the etch rate determined using the tool 133 (FIG. 2A) with the etch rate determined using the tool 152 to determine whether the etch rate determined using the tool 133 is the same as or within a limit of the etch rate determined using the tool 152. For example, the processor 128 determines whether the etch rate ER1001 matches or is within a limit of the etch rate ER1501. As another example, the processor 128 determines whether the etch rate ER1002 matches or is within a limit of the etch rate ER1502. As yet another example, the processor 128 determines whether the etch rate ER1003 matches or is within a limit of the etch rate ER1503. As another example, the processor 128 determines whether the etch rate ER1004 matches or is within a limit of the etch rate ER1504. As another example, the processor 128 determines whether the etch rate ER1005 matches or is within a limit of the etch rate ER1505. As yet another example, the processor 128 determines whether the etch rate ER1006 matches or is within a limit of the etch rate ER1506. As another example, the processor 128 determines whether the etch rate ER1007 matches or is within a limit of the etch rate ER1507. As still another example, the processor 128 determines whether the etch rate ER1008 matches or is within a limit of the etch rate ER1508. As another example, the processor 128 determines whether the etch rate ER1009 matches or is within a limit of the etch rate ER1509. As another example, the processor 128 determines whether the etch rate ER100n matches or is within a limit of the etch rate ER150n.

Upon determining that it is not the case that the etch rate determined using the tool 133 is the same as or within a limit of the etch rate determined using the tool 152, the processor 128 sends a signal to the x MHz RF generator to adjust the voltage $V_2$ and/or the current $I_2$ and/or the power $P_2$ and/or the frequency $F_2$. The processor 128 sends the signal to the x MHz RF generator to adjust the voltage $V_2$ and/or the current $I_2$ and/or the power $P_2$ and/or the frequency $F_2$ to facilitate achieving the etch rate determined using the tool 133. For example, when the etch rate ER1501 does not match or is not within the limit of the etch rate ER1001, the processor 128 sends a signal to the x MHz RF generator to change the voltage $V_2$ and/or the current $I_2$ to facilitate matching the etch rate ER1501 with the etch rate 1001. As another example, when the etch rate ER1505 does not match or is not within the limit of the etch rate ER1005, the processor 128 sends a signal to the x MHz RF generator to change the voltage $V_2$ and/or the current $I_2$ and/or the power $P_2$ to facilitate matching the etch rate ER1505 with the etch rate 1005. As yet another example, when the etch rate ER1506 does not match or is not within the limit of the etch rate ER1006, the processor 128 sends a signal to the x MHz RF generator to change the voltage $V_2$ and/or the current $I_2$ and/or the power $P_2$ and/or the frequency $F_2$ to facilitate matching the etch rate ER1506 with the etch rate 1006.

As still another example, when the etch rate ER1507 does not match or is not within the limit of the etch rate ER1007, the processor 128 sends a signal to the x MHz RF generator to change the voltage $V_2$ and/or the current $I_2$ and/or the power $P_2$ and/or the frequency $F_2$ to facilitate matching the etch rate ER1507 with the etch rate 1007. As another example, when the etch rate ER1508 does not match or is not within the limit of the etch rate ER1008, the processor 128 sends a signal to the x MHz RF generator to change the voltage $V_2$ and/or the current $I_2$ and/or the power $P_2$ and/or the frequency $F_2$ to facilitate matching the etch rate ER1508 with the etch rate 1008. As another example, when the etch rate ER150n is not within a limit of the etch rate ER100n, the processor 128 sends a signal to the x MHz RF generator to change the voltage $V_2$ and/or the current $I_2$ and/or the power $P_2$ and/or the frequency $F_2$ to facilitate matching the etch rate ER100n with the etch rate 150n. As yet another example, when the etch rate ER150n is less than and/or outside a limit of the etch rate ER100n, the processor 128 sends a signal to one or more of the x, y and z MHz RF generators to increase power of one or more corresponding RF signals supplied by the one or more x, y, and z MHz RF generators. The power is increased to achieve the etch rate ER 100n and/or to be within the limit of the etch rate ER100n. As still another example, when the etch rate ER150n is greater than and/or outside a limit of the etch rate ER100n, the processor 128 sends a signal to one or more of the x, y and z MHz RF generators to decrease power of one or more corresponding RF signals supplied by the one or more x, y, and z MHz RF generators. The power is decreased to achieve the etch rate ER 100n and/or to be within the limit of the etch rate ER100n.

Upon receiving a signal from the processor 128 via a line 220, the x MHz RF generator adjusts, e.g., increases, decreases, etc., the voltage $V_2$ and/or current $I_2$ and/or the power $P_2$ and/or the frequency $F_2$ that is generated by the x MHz RF generator to achieve the etch rate that is determined using the tool 133. For example, to achieve the etch rate 100n, the x MHz RF generator adjusts a magnitude of power that is delivered or supplied via the output 160, the RF cable 162, the impedance matching circuit 156, and the RF transmission line 172 to the plasma chamber 158 in which the wafer 178 is placed. As another example, to achieve the etch rate 100n, the x MHz RF generator adjusts a magnitude of power that is reflected from the plasma chamber 158 via the RF transmission line 172, the impedance matching circuit 156, the RF cable 162 and the output 160 towards the x MHz RF generator. As another example, to achieve the etch rate 100n, the x MHz RF generator adjusts a magnitude of voltage of an RF signal and/or a magnitude of a current of the RF signal that is supplied via the output 160, the RF cable 162, the impedance matching circuit 156, and the RF transmission line 172 to the plasma chamber 158. As another example, to achieve the etch rate 100n, the x MHz RF generator adjusts a frequency of an RF signal that is supplied via the output 160, the RF cable 162, the impedance matching circuit 156, and the RF transmission line 172 to the plasma chamber 158.

As yet another example, to achieve the etch rate ER1005 from the etch rate ER1505, the x MHz RF generator adjusts a magnitude of current of an RF signal that is supplied via the output 160 and/or a magnitude of a voltage of the RF signal and/or a magnitude of power that is delivered or supplied in the form of the RF signal via the output 160, the RF cable 162, the impedance matching circuit 156, and the RF transmission line 172 to the plasma chamber 158 in which the wafer 178 is placed. As another example, to achieve the etch rate ER1005 from the etch rate ER1505, the x MHz RF generator adjusts a magnitude of current of an RF signal that is supplied via the output 160 and/or a magnitude of a voltage of the RF signal and/or a magnitude of power that is reflected from the plasma chamber 158 via the RF transmission line 172, the impedance matching circuit 156, the RF cable 162 and the output 160 towards the x MHz RF generator.

As another example, to achieve the etch rate ER1006 from the etch rate ER1506, the x MHz RF generator adjusts a magnitude of current of an RF signal that is supplied via the output 160 and/or a frequency of the RF signal and/or a magnitude of a voltage of the RF signal and/or a magnitude of power that is delivered or supplied in the form of the RF signal via the output 160, the RF cable 162, the impedance matching circuit 156, and the RF transmission line 172 to the plasma chamber 158 in which the wafer 178 is placed. As another example, to achieve the etch rate ER1006 from the etch rate ER1506, the x MHz RF generator adjusts a magnitude of current of an RF signal that is supplied via the output 160 and/or a frequency of the RF signal and/or a magnitude of a voltage of the RF signal and/or a magnitude of power that is reflected from the plasma chamber 158 via the RF transmission line 172, the impedance matching circuit 156, the RF cable 162 and the output 160 towards the x MHz RF generator.

As another example, to achieve the etch rate ER1007 from the etch rate ER1507, the x MHz RF generator adjusts a magnitude of current of an RF signal that is supplied via the output 160 and/or a frequency of the RF signal and/or a magnitude of a voltage of the RF signal and/or a magnitude of power that is delivered or supplied in the form of the RF signal via the output 160, the RF cable 162, the impedance matching circuit 156, and the RF transmission line 172 to the plasma chamber 158 in which the wafer 178 is placed. As another example, to achieve the etch rate ER1007 from the etch rate ER1507, the x MHz RF generator adjusts a magnitude of current of an RF signal that is supplied via the output 160 and/or a frequency of the RF signal and/or a magnitude of a voltage of the RF signal and/or a magnitude of power that is reflected from the plasma chamber 158 via the RF transmission line 172, the impedance matching circuit 156, the RF cable 162 and the output 160 towards the x MHz RF generator.

As another example, to achieve the etch rate ER1008 from the etch rate ER1508, the x MHz RF generator adjusts a magnitude of current of an RF signal that is supplied via the output 160 and/or a frequency of the RF signal and/or a magnitude of a voltage of the RF signal and/or a magnitude of power that is delivered or supplied in the form of the RF signal via the output 160, the RF cable 162, the impedance matching circuit 156, and the RF transmission line 172 to the plasma chamber 158 in which the wafer 178 is placed. As another example, to achieve the etch rate ER1008 from the etch rate ER1508, the x MHz RF generator adjusts a magnitude of current of an RF signal that is supplied via the output 160 and/or a frequency of the RF signal and/or a magnitude of a voltage of the RF signal and/or a magnitude of power that is reflected from the plasma chamber 158 via the RF transmission line 172, the impedance matching circuit 156, the RF cable 162 and the output 160 towards the x MHz RF generator.

When an etch rate determined using the tool 152 matches or is within a limit of an etch rate determined using the tool 133, chamber-to-chamber matching of etch rate is achieved. For example, when the etch rate ER150n is equal to or within a limit of the etch rate ER100n, the processor 128 sends a signal to one or more of the x, y and z MHz RF generators to maintain power of one or more corresponding RF signals supplied by the one or more x, y, and z MHz RF generators. The power is maintained to maintain the etch rate ER 100n and/or to be within the limit of the etch rate ER100n In some embodiments, the processor 128 of the host system 130 maintains a recipe over time for generating plasma within the plasma chambers 118 and 158 during a time the constant etch rate is maintained within the plasma chambers 118 and 158. For example, the processor 128 maintains the same or similar pressure within the plasma chambers 118 and 158 and/or maintains the same or similar temperature within the plasma chambers 118 and 158 and/or maintains the same or similar frequency of the x MHz RF generators within the plasma chambers 118 and 158 and/or maintains the same or similar frequency of the y MHz RF generators within the plasma chambers 118 and 158 and/or maintains the same or similar frequency of the z MHz RF generators within the plasma chambers 118 and 158 and/or maintains same or similar chemistries of one or more process gases within the plasma chambers 118 and 158 and/or maintains same or similar amount of a first gap between the upper electrode 122 and the chuck 120 (FIG. 2A) and a second gap between the upper electrode 176 and the chuck 174. In this example, the pressure within the plasma chamber 118 is similar to the pressure within the plasma chamber 158 when the pressures are within a range of each other. Moreover, in this example, the temperature within the plasma chamber 118 is similar to the temperature within the plasma chamber 158 when the temperatures are within a range of each other. Also, in this example, the frequency of the x MHz RF generator of the plasma system 100 is similar to the frequency of the x MHz RF generator of the plasma system 150 when the frequencies are within a range of each other, the frequency of the y MHz RF generator of the plasma system 100 is similar to the frequency of the y MHz RF generator of the plasma system 150 when the frequencies are within a range of each other, and the frequency of the z MHz RF generator of the plasma system 100 is similar to the frequency of the z MHz RF generator of the plasma system 150 when the frequencies are within a range of each other. Further, in this example, the first gap is similar in amount to the second gap when the first and second gaps are within a range of each other.

In a variety of embodiments, similar chemistries are maintained within the plasma chambers 118 and 158 when an amount of each process gas is maintained within a pre-determined range in each of the plasma chambers 118 and 158 and/or a combination of types of process gases is maintained within a pre-set range within each of the plasma chambers 118 and 158. In some embodiments, similar chemistries are maintained within the plasma chambers 118 and 158 when a combination of types of process gases is maintained within a pre-set range within each of the plasma chambers 118 and 158.

It should be noted that in some embodiments, any number of RF generators are used in the plasma system 150.

Figure 4A:
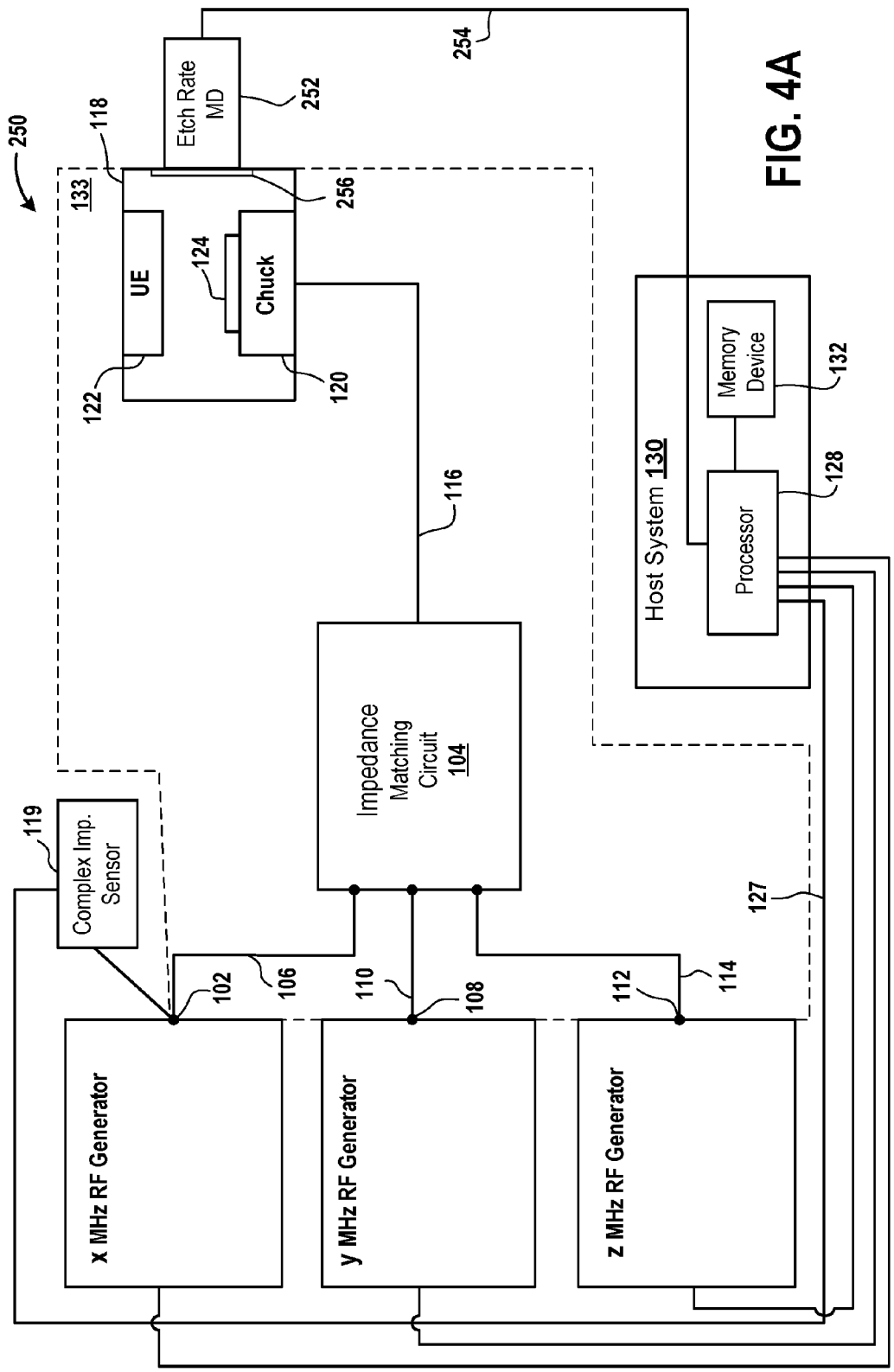
FIG. 4A is a block diagram of an embodiment of a plasma system for determining coefficients of voltage and current used to determine an etch rate, in accordance with some embodiments described in the present disclosure.

FIG. 4A is a block diagram of an embodiment of a plasma system 250 for determining coefficients of voltage and current and/or power, and/or exponents of voltage and current and/or power, and/or frequency used to determine an etch rate. The plasma system 250 includes the plasma system 100 (FIG. 2A) and an etch rate measurement device (ERMD) 252. The ERMD 252 is coupled to the processor 128 via a cable 254 and has a line of sight via a window 256 of the plasma chamber 118. The line of sight is directed into a space in which plasma is generated within the plasma chamber 118. For example, the ERMD 252 includes a spectrophotometer that monitors plasma within the plasma chamber 118 to measure intensity of radiation emitted by the plasma via the window 256. In some embodiments, the window 256 is made of a transparent material that allows light emitted by the plasma to pass through, e.g., glass. In various embodiments, the window 256 is a translucent window. The intensity is directly proportional to an etch rate of a layer of the dummy wafer 124 that is consumed by the plasma. The processor 128 receives the measured intensity via the cable 254 to determine the etch rate as directly proportional to the intensity. As another example, for a known recipe, the ERMD 252 measures a thickness of the dummy wafer 124 at a time tm1 and measures a thickness of the dummy wafer 124 at a time tm2, after time tm1 and after etching the dummy wafer 124. The ERMD 252 determines an etch rate ER2501 of the dummy wafer 124 as a ratio of a difference between the thickness at the time tm2 and the thickness at the time tm1 over a difference between the times tm2 and tm1. The etch rate ER2501 is provided by the ERMD 252 via the cable 254 to the processor 128. In some embodiments, instead of the ERMD 252 determining the etch rate ER2501, the processor 128 determines the etch rate ER 2501 from the measured intensity and provides the etch rate ER 2501 to the memory device 132 for storage. Examples of the known recipe include a pressure maintained within the plasma chamber 118, a temperature maintained within the plasma chamber 118, a gap between the upper electrode 122 and the chuck 120, an amount of power supplied by the x, y, and z MHz RF generators, frequencies of the x, y, and z MHz RF generators, or a combination thereof.

As described above, the complex impedance sensor 119 provides a measurement of a complex voltage and current to the processor 128 via the cable 127. The processor 128 receives the measurement of the complex voltage and current, extracts a voltage magnitude $V_3$ and a current magnitude $I_3$ and/or a power magnitude $P_3$ from the measurement and provides the voltage magnitude $V_3$, the current magnitude $I_3$, and the power magnitude $P_3$ to the memory device 132 for storage. For example, the processor 128 calculates the power magnitude $P_3$ as a multiplication of the voltage magnitude $V_3$, the current magnitude $I_3$, and a phase $\phi_3$ between the voltage magnitude $V_3$ and the current magnitude $I_3$. In some embodiments, the voltage magnitude $V_3$ is the same as the voltage magnitude $V_1$, the current magnitude $I_3$ is the same as the current magnitude $I_1$, the power magnitude $P_3$ is the same as the power magnitude $P_1$ and the phase $\phi_3$ is the same as the phase $\phi_1$ that is determined by using the plasma system 100. In some embodiments, a frequency sensor that is coupled to the output 102 measures a frequency $F_3$ of an RF signal that is supplied by the x MHz RF generator and provides the frequency $F_3$ to the processor 128 via cable connecting the frequency sensor to the processor 128. In various embodiments, the frequency $F_3$ is the same as the frequency $F_1$.

In some embodiments, instead of the plasma system 100, another plasma system is used to determine coefficients of voltage and current and/or power, and/or exponents of voltage and current and/or power, and/or frequency used to determine an etch rate. For example, an impedance matching circuit that has the same structure and/or same function as that of the impedance matching circuit 104 and/or has a different identification number than that of the impedance matching circuit 104 is used instead of the impedance matching circuit 104. As another example, a cable that has the same structure and/or same function as that of the cable 106 and/or has a different identification number than that of the cable 106 is used instead of the cable 106. As yet another example, an RF transmission line that has the same structure and/or same function as that of the RF transmission line 116 and/or has a different identification number than that of the RF transmission line 116 is used instead of the RF transmission line 116. As another example, a plasma chamber that has the same structure and/or same function as that of the plasma chamber 118 and/or has a different identification number than that of the plasma chamber 118 is used instead of the plasma chamber 118.

In various embodiments, instead of the dummy wafer 124, a semiconductor wafer is used in the plasma system 250 when the x, y, and/or z MHz RF generators generate the RF signals to measure the intensity of plasma within the plasma chamber 118 and to measure complex voltage and current at the output 102.

In a number of embodiments, the plasma system 250 includes any number of RF generators.

Figure 4B:
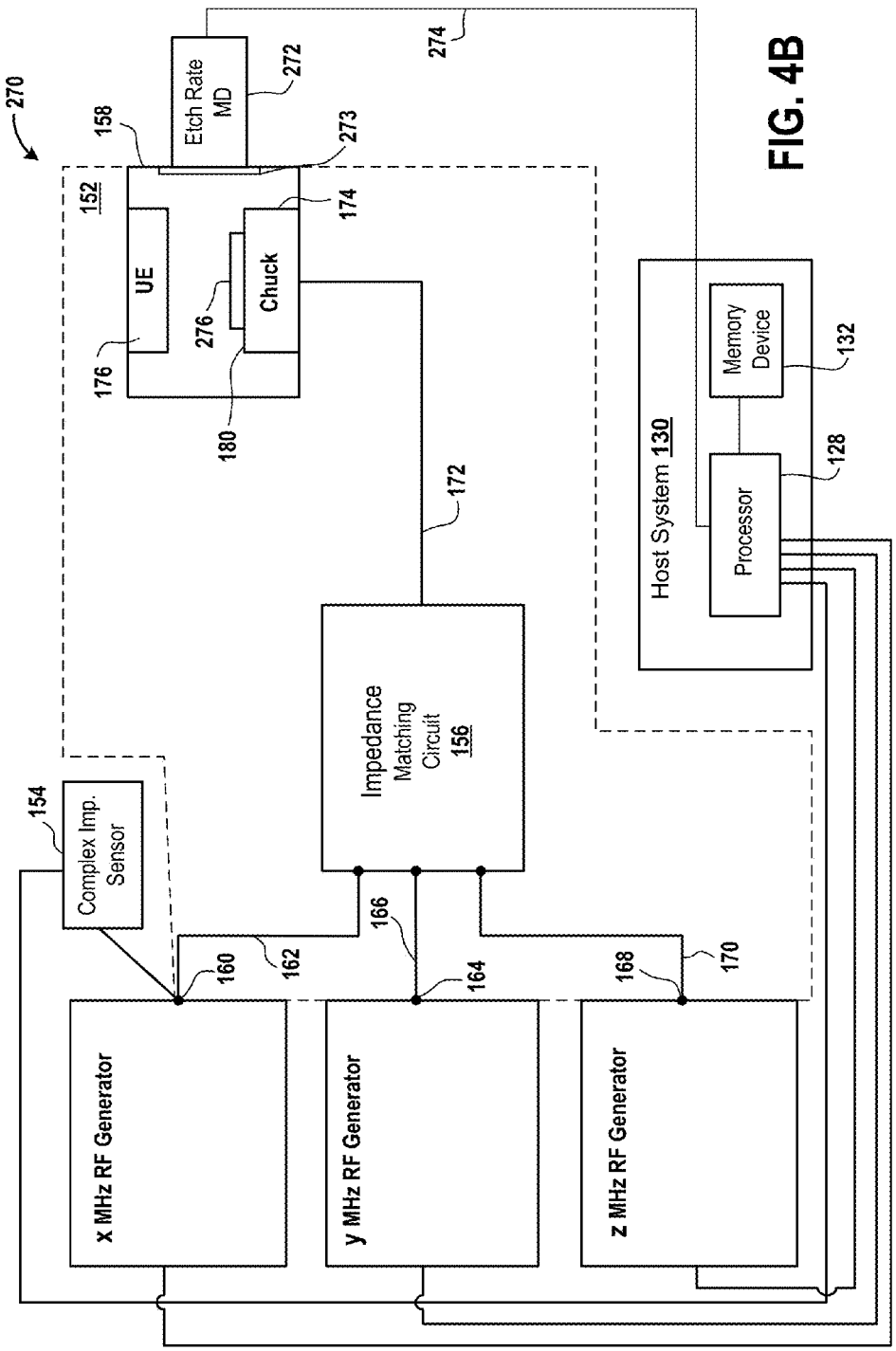
FIG. 4B is a block diagram of an embodiment of another plasma system for determining coefficients of voltage and current used to determine an etch rate, in accordance with various embodiments described in the present disclosure.

FIG. 4B is a block diagram of an embodiment of a plasma system 270 for determining coefficients of voltage and current and/or power, and/or exponents of voltage and current and/or power, and/or frequency used to determine an etch rate. The plasma system 270 is the same as the plasma system 150 (FIG. 2B) except that a dummy wafer 276 is used in the plasma chamber 158 instead of the semiconductor wafer 178 (FIG. 2B). Moreover, the plasma system 270 includes an ERMD 272, which measures an etch rate ER2701. The etch rate ER2701 is provided by the ERMD 272 via a cable 274 to the processor 128.

In various embodiments, instead of determining the etch rate ER2701, the ERMD 272 measures intensity of light emitted by plasma generated within the plasma chamber 158 via a window 273 of the plasma chamber 158 and provides the measured intensity to the processor 128 via the cable 274. The cable 274 couples the ERMD 272 to the processor 128. In some embodiments, the processor 128 determines the etch rate ER 2701 as being directly proportional to the measured intensity and provides the etch rate ER 2701 to the memory device 132 for storage.

The processor 128 also receives the complex voltage and current that is measured at the output 160 by the complex impedance sensor 154, extracts a voltage magnitude $V_4$ and a current magnitude $I_4$ and/or a power magnitude $P_4$ from the complex voltage and current, and provides the voltage magnitude $V_4$ and the current magnitude $I_4$ and/or the power magnitude $P_4$ to the memory device 132 for storage. In some embodiments, the voltage $V_4$ magnitude is equal to the voltage magnitude $V_2$, the current magnitude $I_4$ is equal to the current magnitude $I_2$, and the power magnitude $P_4$ is equal to the power magnitude $P_2$.

In some embodiments, a frequency sensor that is coupled to the output 160 measures a frequency $F_4$ of an RF signal that is supplied by the x MHz RF generator. In some embodiments, the frequency $F_4$ is the same as the frequency $F_2$.

In some embodiments, any number of plasma systems are used to determine unknowns, e.g., coefficients, exponents, etc., of an etch rate. For example, a number of unknowns is equal to a number of plasma systems that are used to determine the unknowns. As yet another example, the processor 128 determines coefficients of the voltage $V_1$ and of the current $I_1$ based on the etch rate ER 2501 determined using the plasma system 250 (FIG. 4A), the etch rate ER 2701, the voltages $V_3$ and $V_4$, and the currents $I_3$ and $I_4$. To illustrate, the processor 128 determines the coefficients $C_{11}$ and $C_{12}$ by solving for the coefficients in the etch rate ER 2501 that is equal to $C_{11}V_3+C_{12}I_3$ and in the etch rate ER 2701 that is equal to $C_{11}V_4+C_{12}I_4$.

As another example, the processor 128 determines the coefficients $C_{21}$, $C_{22}$, $C_{23}$, $C_{24}$, and $C_{25}$ of the voltage $V_1$ and of the current $I_1$ based on the etch rate ER 2501 determined using the plasma system 250 (FIG. 4A), the etch rate ER 2701, three additional etch rates determined using three additional plasma systems, the voltages $V_3$ and $V_4$ and three additional voltages $V_5$, $V_6$, and $V_7$ determined using the three additional plasma systems, the currents $I_3$ and $I_4$ and three additional currents $I_5$, $I_6$, and $I_7$ determined using the three additional plasma systems. To illustrate, the processor 128 determines the coefficients $C_{21}$, $C_{22}$, $C_{23}$, $C_{24}$, and $C_{25}$ by solving for the coefficients in the etch rate ER 2501 that is equal to $C_{21}V_3+C_{22}I_3+C_{23}V_3^2+C_{24}V_3I_3+C_{25}I_3^2$, the etch rate 2701 that is equal to $C_{21}V_4+C_{22}I_4+C_{23}V_4^2+C_{24}V_4I_4+C_{25}I_4^2$, one of the three additional etch rates that is equal to $C_{21}V_5+C_{22}I_5+C_{23}V_5^2+C_{24}V_5I_5+C_{25}I_5^2$, a second one of the three additional etch rates that is equal to $C_{21}V_6+C_{22}I_6+C_{23}V_6^2+C_{24}V_6I_6+C_{25}I_6^2$, and a third one of the three additional etch rates that is equal to $C_{21}V_7+C_{22}I_7+C_{23}V_7^2+C_{24}V_1I_7+C_{25}I_7^2$.

As still another example, the processor 128 determines the coefficient $C_{55}$ of the voltage $V_1$, the coefficient $C_{56}$ of the power $P_1$ and the coefficient $C_{57}$ of the current $I_1$, and the exponent $e_1$ of the voltage $V_1$, and the exponent $e_2$ of the power $P_1$. The processor 128 determines the coefficients $C_{55}$, $C_{56}$, and $C_{57}$ and the exponents $e_1$ and $e_2$ based on the etch rate ER 2501 determined using the plasma system 250 (FIG. 4A), the etch rate ER 2701, three additional etch rates determined using three additional plasma systems, the voltage magnitudes $V_3$ and $V_4$ and three additional voltage magnitudes $V_5$, $V_6$, and $V_7$ determined using the three additional plasma systems, the current magnitudes $I_3$ and $I_4$ and three additional current magnitudes $I_5$, $I_6$, and $I_7$ determined using the three additional plasma systems, the power magnitudes $P_3$ and $P_4$, and power magnitudes $P_5$, $P_6$, and $P_7$ determined using the three additional plasma systems.

As another example, the processor 128 determines the coefficient $C_{55}$ of the voltage $V_1$, the coefficient $C_{56}$ of the power $P_1$, the coefficient $C_{57}$ of the current $I_1$, the coefficient $C_{58}$ of the frequency $F_1$, and the exponent $e_1$ of the voltage $V_1$, the exponent $e_2$ of the power $P_1$, the exponent $e_3$ of the current $I_1$, and the exponent $e_4$ of the frequency $F_1$. The processor 128 determines the coefficients $C_{55}$, $C_{56}$, $C_{57}$, and $C_{58}$ and the exponents $e_1$, $e_2$, $e_3$, and $e_4$ based on the etch rate ER 2501 determined using the plasma system 250 (FIG. 4A), the etch rate ER 2701, six additional etch rates determined using six additional plasma systems, the voltage magnitudes $V_3$ and $V_4$ and six additional voltage magnitudes $V_5$, $V_6$, $V_7$, $V_8$, $V_9$, and $V_{10}$ determined using the six additional plasma systems, the current magnitudes $I_3$ and $I_4$ and six additional current magnitudes $I_5$, $I_6$, $I_7$, $I_8$, $I_9$, and $I_{10}$ determined using the six additional plasma systems, the power magnitudes $P_3$ and $P_4$ and six additional power magnitudes $P_s$, $P_6$, $P_7$, $P_8$, $P_9$, and $P_{10}$ determined using the six additional plasma systems, and the frequencies $F_3$ and $F_4$ and six additional frequencies $F_5$, $F_6$, $F_7$, $F_8$, $F_9$, and $F_{10}$ determined using the six additional plasma systems.

In some embodiments, instead of the plasma system 270, another plasma system is used to determine coefficients and/or exponents of voltage magnitudes and/or coefficients and/or exponents of current magnitudes and/or coefficients and/or exponents of power magnitudes and/or coefficients and/or exponents of frequencies that are used to determine an etch rate. For example, an impedance matching circuit that has the same structure and/or same function as that of the impedance matching circuit 156 and/or has a different identification number than that of the impedance matching circuit 156 is used instead of the impedance matching circuit 156. As another example, a cable that has the same structure and/or same function as that of the cable 162 and/or has a different identification number than that of the cable 162 is used instead of the cable 162. As yet another example, an RF transmission line that has the same structure and/or same function as that of the RF transmission line 172 and/or has a different identification number than that of the RF transmission line 172 is used instead of the RF transmission line 172. As another example, a plasma chamber that has the same structure and/or same function as that of the plasma chamber 158 and/or has a different identification number than that of the plasma chamber 158 is used instead of the plasma chamber 158.

In various embodiments, instead of the dummy wafer 276, a semiconductor wafer is used in the plasma system 270 when the x, y, and/or z MHz RF generators generate the RF signals to measure the intensity of plasma within the plasma chamber 158 and to measure complex voltage and current at the output 160.

Figure 5:
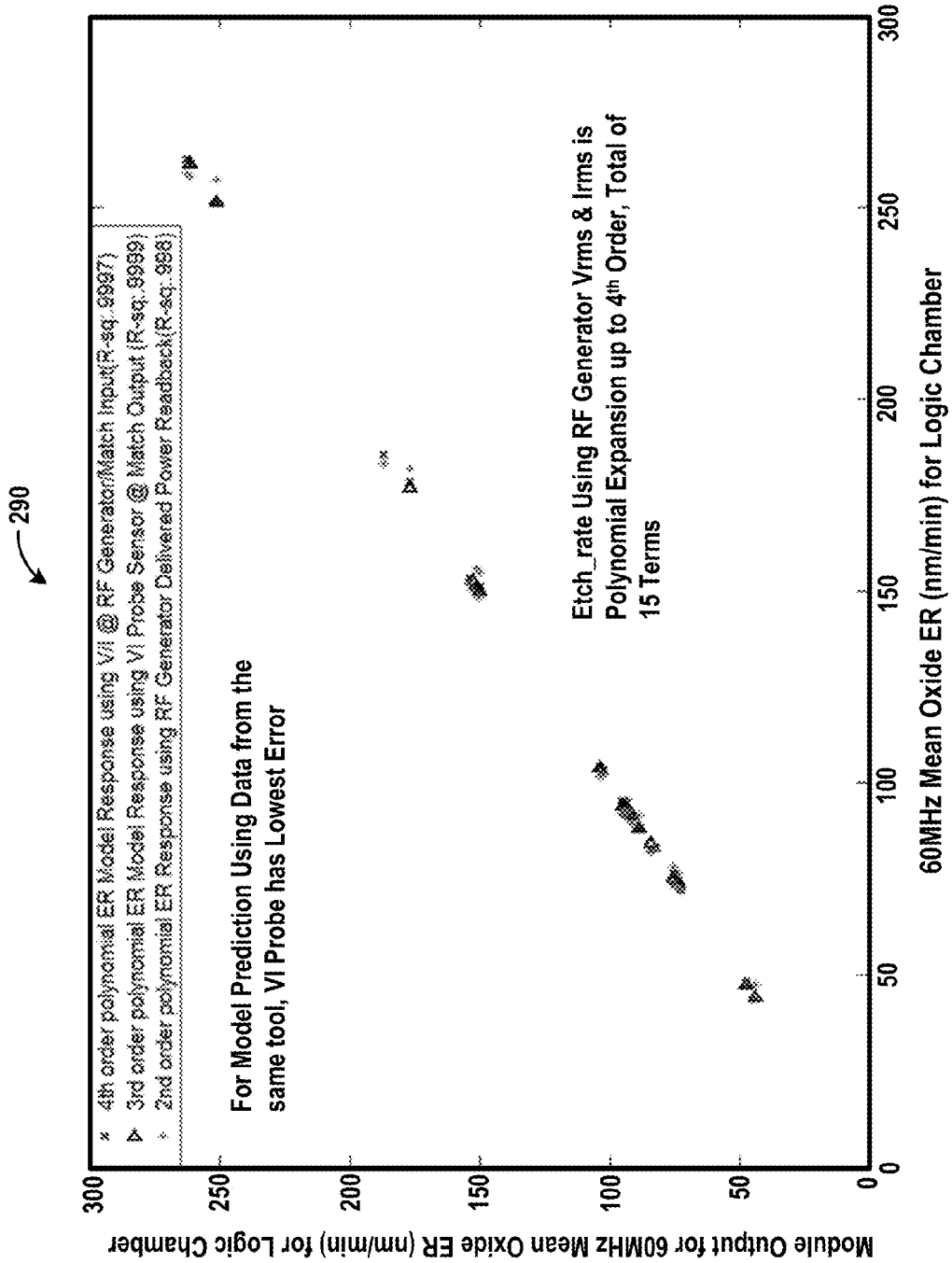
FIG. 5 is an embodiment of a graph that plots mean values of an etch rate model versus a mean value of measured etch rate, determined using an etch rate measurement device (ERMD) when a z megahertz (MHz) RF generator is operational and x and y MHz RF generators are nonoperational, in accordance with several embodiments described in the present disclosure.

FIG. 5 is an embodiment of a graph 290 that plots mean values of an etch rate model, e.g., a second order polynomial etch rate, a third order polynomial etch rate, a fourth order polynomial etch rate, etc., versus, versus a mean value of measured etch rate, determined using an ERMD when the z MHz RF generator is operational, e.g., supplying power, working, functional, etc., and the x and y MHz RF generators are nonoperational, e.g., not supplying power, etc. The mean measured etch rate determined using an ERMD is plotted along an x-axis and the mean etch rate model is plotted along a y-axis. A best fit straight line may be drawn through various points for each mean etch rate model of the graph 290. As shown, the second order polynomial mean etch rate model in the graph 290 has a coefficient of determination ($R^2$) of 0.998, the third order polynomial mean etch rate model in the graph 290 has an $R^2$ of 0.9999 and the fourth order polynomial mean etch rate model in the graph 290 has an $R^2$ of 0.9997. The greater the $R^2$, the more accurate mean values of an etch rate model.

Figure 6:
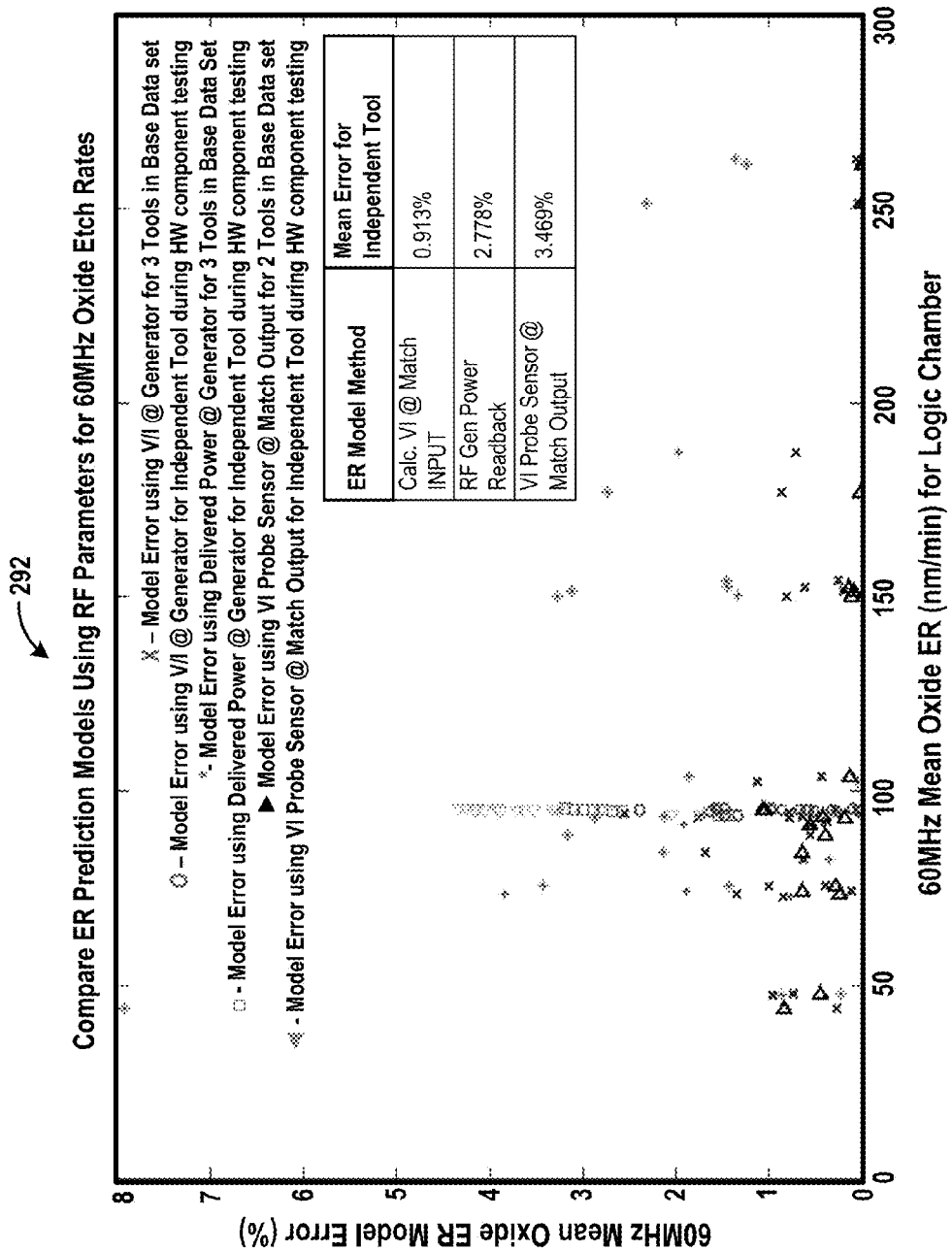
FIG. 6 is an embodiment of a graph that plots an error in mean values of an etch rate model versus a mean etch rate when the z MHz RF generator is operational and the x and y MHz RF generators are nonoperational, in accordance with some embodiments described in the present disclosure.

FIG. 6 is an embodiment of a graph 292 that plots an error in mean values of an etch rate model versus a mean etch rate, which is measured using an ERMD, when the z MHz RF generator is operational and the x and y MHz RF generators are nonoperational. The "x"s, asterisks "*", and triangles that have a vertex pointing to the right side in the graph 292 represent errors in mean values of an etch rate model versus mean values of measured etch rates when two or more different tools are used. The circles, squares, and triangles that have a vertex that point to the left side in the graph 292 represent errors in mean values of an etch rate model versus mean values of measured etch rates when an independent tool other than the two or more different tools is used.

Figure 7A:
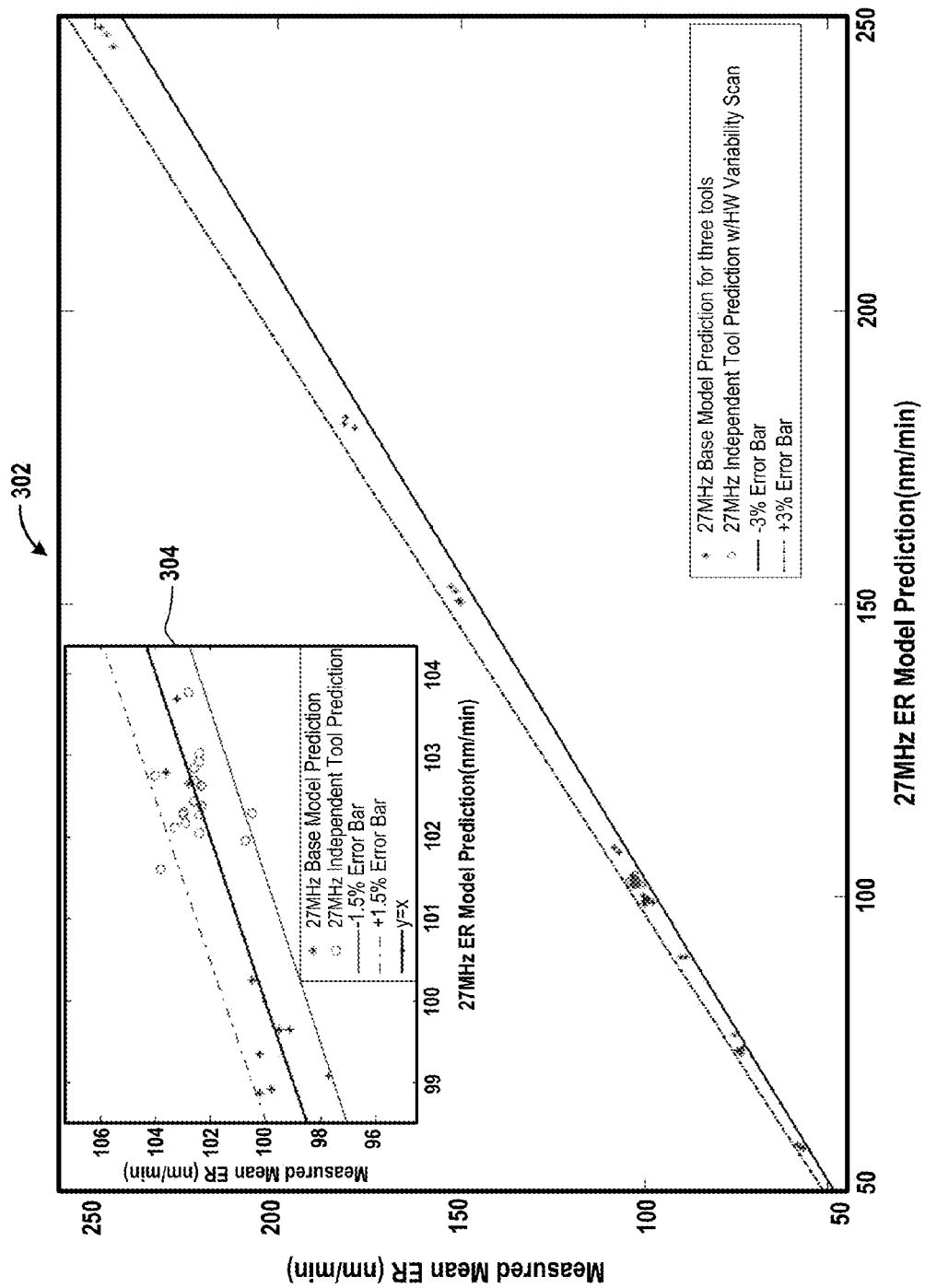
FIG. 7A shows embodiments of graphs that plot mean measured etch rates versus modeled etch rates to illustrate a generally linear relationship between the measured and modeled etch rates when a 27 megahertz radio frequency generator is operational, in accordance with some embodiments described in the present disclosure.

FIG. 7A shows embodiments of a graph 302 and a graph 304. Each graph 302 and 304 plots a mean etch rate, which is measured using an ERMD, versus a modeled etch rate, when the y MHz RF generator is operational and the x and z MHz RF generators are nonoperational. The measured etch rate is plotted on a y-axis and the modeled etch rate is plotted on an x-axis. The asterisks "*" in the graph 302 represent mean measured etch rates versus modeled etch rates when three different tools are used. The circles in the graph 302 represent measured etch rates versus modeled etch rates when an independent tool other than the three tools is used. It should be noted that the asterisks "*" of the graph 302 generally fit to a straight line. The graph 304 is a zoom-in of a portion of the graph 302.

Figure 7B:
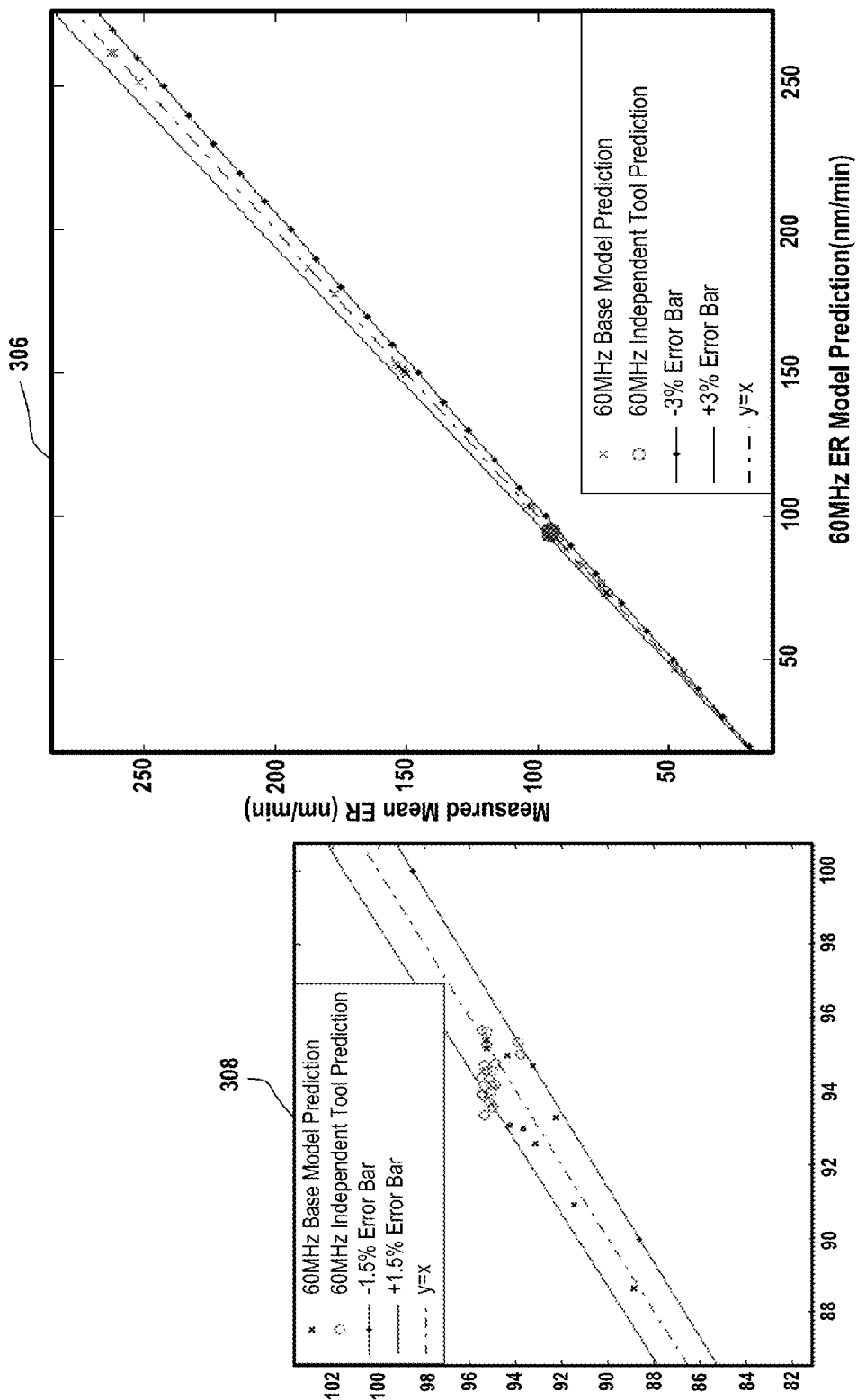
FIG. 7B shows embodiments of graphs that plot mean measured etch rates versus modeled etch rates to illustrate a generally linear relationship between the measured and modeled etch rates when a 60 megahertz radio frequency generator is operational, in accordance with some embodiments described in the present disclosure.

FIG. 7B shows embodiments of a graph 306 and a graph 308. Each graph 306 and 308 plots a mean etch rate, which is measured using an ERMD, versus a modeled etch rate, when the z MHz RF generator is operational and the x and y MHz RF generators are nonoperational. The asterisks "*" in the graph 306 represent measured etch rates versus modeled etch rates when three different tools are used. The circles in the graph 306 represent measured etch rates versus modeled etch rates when an independent tool other than the three tools is used. It should be noted that the asterisks "*" of the graph 306 generally fit to a straight line. The graph 308 is a zoom-in of a portion of the graph 306.

In some embodiments, instead of connecting a complex impedance sensor to an output of an RF generator, the complex impedance sensor is coupled to an input of an impedance matching circuit that is connected to the output of the RF generator. In these embodiments, a frequency sensor is coupled to the input of the impedance matching circuit.

In various embodiments, instead of connecting a complex impedance sensor to an output of an RF generator, the complex impedance sensor is coupled to an output of an impedance matching circuit that is connected to the output of the RF generator. In these embodiments, a frequency sensor is coupled to the output of the impedance matching circuit Although the above-described embodiments are described in terms of etch rate, in various embodiments, a sputtering rate can be used instead of the etch rate. For example, in some embodiments, sputtering rate and etch rate are used interchangeably herein.

It is noted that although the above embodiments are described with reference to complex voltage and current at an output of an RF generator, the above embodiments apply equally as well to complex voltage and current at an input of the impedance matching circuit 104 (FIGS. 2A & 2B) and to complex voltage and current at an input of the impedance matching circuit 156 (FIGS. 4A & 4B). For example, the complex voltage and current measured at the output 102 is the same as the complex voltage and current at the input 161 of the impedance matching circuit 104 (FIGS. 2A & 4A). As another example, the complex voltage and current measured at the output 160 (FIGS. 2B & 4B) is the same as the complex voltage and current at the input 161 of the impedance matching circuit 104 (FIGS. 2B & 4B). As yet another example, a model etch rate determined based on the complex voltage and current determined at the output 102 is the same as a model etch rate at the input 161.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an ICP reactor, a TCP reactor, conductor tools, dielectric tools, a plasma chamber including an ECR reactor, etc. For example, the x MHz RF generator, the y MHz RF generator, and the z MHz RF generator are coupled to an inductor within the ICP plasma chamber.

It is also noted that although the operations above are described as being performed by the processor 128 (FIGS. 2A, 2B, 4A, and 4B), in some embodiments, the operations may be performed by one or more processors of the host system 130 or by multiple processors of multiple host systems or by a combination of a DSP of an RF generator and a processor of a host system.

It should be noted that although the above-described embodiments relate to providing an RF signal to the lower electrode of a chuck of a plasma chamber, and grounding an upper electrode of the plasma chamber, in several embodiments, the RF signal is provided to the upper electrode while the lower electrode is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for performing chamber-to-chamber matching of etch rates based on a model etch rate, the method comprising:
   receiving a voltage and current measured at an output of a radio frequency (RF) generator of a first plasma system;
   calculating a first model etch rate based on the voltage and current, and a power, the power calculated based on the voltage and current and a phase between the voltage and current;
   receiving a voltage and current measured at an output of an RF generator of a second plasma system;
   determining a second model etch rate based on the voltage and current at the output of the RF generator of the second plasma system;
   comparing the second model etch rate with the first model etch rate; and
   adjusting a power at the output of the RF generator of the second plasma system to achieve the first model etch rate associated with the first plasma system upon determining that the second model etch rate does not match the first model etch rate,
   wherein the method is executed by a processor.

2. The method of claim 1, further comprising adjusting the voltage or current at the output of the RF generator of the second plasma system to achieve the first model etch rate associated with the first plasma system.

3. The method of claim 1, wherein the voltage and current used to calculate the first model etch rate includes a voltage magnitude and a current magnitude, and the phase between the voltage magnitude and the current magnitude, and the power used to calculate the first model etch rate includes a power magnitude, the power magnitude calculated as a product of the voltage magnitude, the current magnitude, and the phase.

4. The method of claim 1, further comprising:
   receiving a frequency measured at the output of the RF generator of the first plasma system;
   calculating a third model etch rate based on the frequency;
   receiving a frequency measured at the output of the RF generator of the second plasma system;
   determining a fourth model etch rate based on the frequency measured at the output of the RF generator of the second plasma system;
   comparing the third model etch rate with the fourth model etch rate; and
   adjusting the power at the output of the RF generator of the second plasma system to achieve the third model etch rate associated with the first plasma system.

5. The method of claim 4, further comprising adjusting the frequency at the output of the RF generator of the second plasma system to achieve the third model etch rate associated with the first plasma system.

6. The method of claim 4, wherein receiving the voltage and current and the frequency measured at the output of the RF generator of the first plasma system is performed using a dummy wafer in a plasma chamber of the first plasma system.

7. The method of claim 1, wherein the RF generator of the first plasma system is coupled to an impedance matching circuit via a cable, and wherein the impedance matching circuit is coupled to a plasma chamber via an RF transmission line.

8. The method of claim 1, wherein the output of the RF generator of the first plasma system is coupled to an input of an impedance matching circuit, wherein the output is used to facilitate transfer of an RF signal to a plasma chamber via the impedance matching circuit.

9. The method of claim 1, wherein adjusting the power at the output of the RF generator of the second plasma system is performed when the second plasma system is used to etch a semiconductor wafer.

10. The method of claim 1, wherein adjusting the power includes increasing or decreasing the power measured at the output of the RF generator of the second plasma system.

11. The method of claim 1, wherein the first plasma system includes a tool that is identical in function to a tool of the second plasma system and has a different identification than that of the second plasma system.

12. The method of claim 1, wherein the first plasma system includes a tool that is identical in structure to a tool of the second plasma system and has a different identification than that of the second plasma system.

13. The method of claim 1, wherein the first plasma system includes a tool that is identical in structure and function to a tool of the second plasma system and has a different identification than that of the second plasma system.

14. The method of claim 1, wherein calculating the first model etch rate including calculating a sum, wherein the sum is a Taylor series.

15. A method for performing in-chamber matching of etch rates based on a model etch rate, the method comprising:
   receiving a voltage and current measured at a first time at an output of a radio frequency (RF) generator of a plasma system;
   calculating a first model etch rate based on the voltage, the current, and a power, the power calculated based on a phase between the voltage and the current;

receiving a voltage and a current measured at a second time at the output of the RF generator;

calculating a second model etch rate based on the voltage measured at the second time, the current measured at the second time, and a power, the power calculated based on a phase between the voltage measured at the second time and the current measured at the second time;

comparing the first model etch rate with the second model etch rate; and adjusting power at the output of the RF generator to achieve the first model etch rate upon determining that the second model etch rate does not match the first model etch rate, wherein the method is executed by a processor.

16. The method of claim 15, further comprising:

receiving a frequency measured at the first time at the output of the RF generator;

calculating a third model etch rate based on the frequency;

receiving a frequency measured at the second time at the output of the RF generator;

calculating a fourth model etch rate based on the frequency measured at the second time;

comparing the third model etch rate with the fourth model etch rate; and adjusting the power at the output of the RF generator to achieve the third model etch rate upon determining that the third model etch rate does not match the fourth model etch rate.

17. The method of claim 16, further comprising:

adjusting the voltage or current or frequency at the output of the RF generator to achieve the third model etch rate.

18. The method of claim 16, wherein receiving the voltage, the current, and the frequency measured at the first time at the output of the RF generator is performed using a dummy wafer in a plasma chamber of the plasma system.

19. The method of claim 15, wherein the second time occurs after the first time.

20. The method of claim 15, wherein the voltage and current used to calculate the first model etch rate includes a voltage magnitude, a current magnitude, and the phase between the voltage magnitude and the current magnitude, and the power used to calculate the first model etch rate includes a power magnitude.

21. The method of claim 15, wherein adjusting the power at the output of the RF generator is performed when the plasma system is used to etch a semiconductor wafer.

22. A first plasma system comprising:

a radio frequency (RF) generator for generating an RF signal, the RF generator including an output for facilitating transfer of the RF signal;

a complex impedance sensor coupled to the output for measuring a voltage and current of the RF signal;

a plasma chamber for generating plasma;

an impedance matching circuit coupled to the RF generator via a cable and coupled to the plasma chamber via an RF transmission line for modifying the RF signal to generate a modified RF signal;

wherein the plasma chamber is configured to generate the plasma when the modified RF signal is received from the impedance matching circuit;

a processor coupled to the complex impedance sensor for:
receiving the voltage and current measured at the output of the RF generator;

calculating a first model etch rate based on the voltage and current, and a power, the power calculated based on the voltage and current and a phase between the voltage and current;

receiving a voltage and current measured at an output of an RF generator of a second plasma system;

determining a second model etch rate based on the voltage and current at the output of the RF generator of the second plasma system;

comparing the second model etch rate with the first model etch rate; and adjusting a power at the output of the RF generator of the first plasma system to achieve the first model etch rate upon determining that the second model etch rate does not match the first model etch rate.

23. The first plasma system of claim 22, wherein the processor is further configured to adjust the voltage or the current at the output of the RF generator of the first plasma system to achieve the first model etch rate.

* * * * *